United States Patent
Shibata et al.

(10) Patent No.: US 8,129,768 B2
(45) Date of Patent: Mar. 6, 2012

(54) INTEGRATED CIRCUIT DEVICE, MANUFACTURING METHOD THEREOF, AND DISPLAY DEVICE

(75) Inventors: Akihide Shibata, Nara (JP); Katsumasa Fujii, Yamatokoriyama (JP); Yutaka Takafuji, Nara (JP); Hiroshi Iwata, Nara (JP)

(73) Assignees: Sharp Kabushiki Kaisha, Osaka (JP); Nanosys, Inc., Palo Alto, CA (US)

( * ) Notice: Subject to any disclaimer, the term of this patent is extended or adjusted under 35 U.S.C. 154(b) by 1208 days.

(21) Appl. No.: 11/802,706

(22) Filed: May 24, 2007

(65) Prior Publication Data

US 2008/0042120 A1 Feb. 21, 2008

(30) Foreign Application Priority Data

May 26, 2006 (JP) ................................. 2006-147283

(51) Int. Cl.
*H01L 29/772* (2006.01)
(52) U.S. Cl. .................. 257/296; 257/532; 257/E51.04; 257/746; 257/784; 977/762; 977/781; 977/789
(58) Field of Classification Search .................. 257/532, 257/E27.113; 438/393; 977/762
See application file for complete search history.

(56) References Cited

U.S. PATENT DOCUMENTS

| 7,135,728 B2 * | 11/2006 | Duan et al. ..................... 257/296 |
| 2004/0112964 A1 * | 6/2004 | Empedocles et al. ......... 235/491 |
| 2004/0135951 A1 | 7/2004 | Stumbo et al. |
| 2005/0051805 A1 | 3/2005 | Kim et al. |
| 2005/0067241 A1 | 3/2005 | Holiviers et al. |
| 2005/0079659 A1 | 4/2005 | Duan et al. |
| 2005/0110064 A1 | 5/2005 | Duan et al. |
| 2005/0181587 A1 | 8/2005 | Duan et al. |
| 2006/0151820 A1 | 7/2006 | Duan et al. |
| 2006/0169788 A1 | 8/2006 | Empedocles et al. |
| 2006/0211183 A1 | 9/2006 | Duan et al. |
| 2006/0237537 A1 | 10/2006 | Empedocles et al. |
| 2006/0256059 A1 | 11/2006 | Stumbo et al. |
| 2007/0012980 A1 | 1/2007 | Duan et al. |

(Continued)

FOREIGN PATENT DOCUMENTS

EP 1 508 926 A1 2/2005

(Continued)

OTHER PUBLICATIONS

Dongmok Whang et al. "Nanolithography Using Hierarchically Assembled Nanowire Masks" Nano Letters, vol. 3, No. 7, 2003, p. 951-954.

*Primary Examiner* — Zandra Smith
*Assistant Examiner* — Tsz Chiu
(74) *Attorney, Agent, or Firm* — Birch, Stewart, Kolasch & Birch, LLP

(57) ABSTRACT

An integrated circuit device of the present invention includes a substrate on which at least two types of nano wire element are provided. These nano wire elements have functions and materials different from each other. The nano wire elements are constituted by nano wires having sizes differing depending on types of nano wire element. With this, it is possible to dramatically improve a function of the integrated circuit device, as compared with an integrated circuit device including a substrate on which one type of nano wire element is provided.

10 Claims, 18 Drawing Sheets

U.S. PATENT DOCUMENTS

| | | |
|---|---|---|
| 2007/0120167 A1 | 5/2007 | Duan et al. |
| 2007/0126044 A1 | 6/2007 | Shioya et al. |
| 2007/0126079 A1* | 6/2007 | Shioya et al. ............ 257/532 |
| 2007/0176824 A1 | 8/2007 | Stumbo et al. |
| 2007/0228439 A1 | 10/2007 | Duan et al. |
| 2009/0266974 A1 | 10/2009 | Verhulst et al. |
| 2010/0155696 A1 | 6/2010 | Duan et al. |
| 2010/0171025 A1 | 7/2010 | Verhulst et al. |
| 2011/0045660 A1 | 2/2011 | Romano et al. |
| 2011/0312163 A1 | 12/2011 | Romano et al. |

FOREIGN PATENT DOCUMENTS

| | | |
|---|---|---|
| JP | 2005-197612 A | 7/2005 |
| JP | 2006-501689 A | 1/2006 |
| JP | 2006-93390 A | 4/2006 |
| JP | 2007-43150 A | 2/2007 |
| JP | 2007-184555 A | 7/2007 |

\* cited by examiner

INTEGRATED CIRCUIT DEVICE, MANUFACTURING METHOD THEREOF, AND DISPLAY DEVICE

This Nonprovisional application claims priority under 35 U.S.C. §119(a) on Patent Application No. 2006/147283 filed in Japan on May 26, 2006, the entire contents of which are hereby incorporated by reference.

FIELD OF THE INVENTION

The present invention relates to an integrated circuit device using nano wire elements, a manufacturing method thereof, and utilization of the integrated circuit device and the manufacturing method. More specifically, the present invention relates to an integrate circuit device in which a plurality of nano wire elements are provided in rows, a manufacturing method thereof, and a display device using such an integrated circuit device.

BACKGROUND OF THE INVENTION

Performance of a large-scale integrated circuit (LSI) has been dramatically improved in terms of capacity, processing speed, and electric power consumption as a result of miniaturization of elements.

However, it is considered that limitation of miniaturization of an element that is based on a conventional operation principle is 0.1 μm. For this reason, researches for a new element based on an operation principle different from the conventional one are now actively conducted. A specific example of such a new element is an element using a quantum wire. The quantum wire is a semiconductor element that is so formed as to have a width as long as the wavelength of the de Broglie wave that is an electron existing in a semiconductor crystal. In cases where a semiconductor is so formed as to have such a width, an electron is confined in the semiconductor layer. This restrains freedom in movement of the electron. Such restriction of the movement of the electron allows a quantum effect. In accordance with the operation principle using this quantum effect, the element using the quantum wire operates.

The quantum wire has a nano meter size cross sectional surface, so that the quantum wire has a new property different from that of a bulk. For example, the quantum wire makes it possible to maintain the phase of an electron wave therein. The electron wave has a wavelength of approximately 10 nm in a semiconductor crystal. Now, think that electrons are generated in a thin-line-like semiconductor (quantum wire) having a rectangular cross sectional surface having a side whose length is approximately 10 nm. In this case, the electrons are hardly dispersed. Hence, each of the electrons is kept within the quantum wire and moves only therein, with the result that the phase of the electron wave is maintained.

One example of usage of such a quantum wire is to use the quantum wire for a transistor. The quantum wire renders the transistor excellent performance. This is specifically explained as follows, for example. That is, a multiplicity of such quantum wires are provided in rows on a substrate, thus forming a gate electrode. Below the gate electrode, a conductive layer for conducting carriers is provided. By controlling an applied voltage to the gate electrode, the number of carriers in the conductive layer is increased or decreased. According to such a structure, it is possible to manufacture a transistor excellent in high-speed operationality and low noise property.

As a conventional and publicly known method for manufacturing a silicon quantum wire, there is a method for growing a silicon quantum wire directly on a silicon substrate in accordance with the VLS (Vapor-Liquid-Solid) method. In this manufacturing method, gold (Au) is deposited on the silicon substrate such that molten alloy drops of silicon and gold are formed on a surface of the silicon substrate, and then supply of a source gas of silicon and heating are carried out simultaneously for the sake of growing the silicon quantum wire.

However, in cases where the VLS method is used, it is difficult to control the size of each molten alloy drop and the formation location thereof. This makes it impossible to form, at equal intervals, silicon quantum wires having the same thickness. This is problematic. Hence, with the conventional technique, it is difficult to provide a multiplicity of quantum wires in rows.

Nano Letters, Vol. 3, No. 7 (2003) p.p. 951-954 (Citation 1) describes a method for assembling a multiplicity of silicon quantum wires on a substrate having a large area. The method described in Citation 1 uses the Langmuir-Blodget method. In the method, manufactured silicon quantum wires are separated off and are allocated on the substrate having the large area. The use of this method makes it possible to simultaneously assemble the multiplicity of silicon nano wires on electrode locations in a pattern formed on the substrate. In the meanwhile, Japanese Unexamined Patent Publication Tokukai 2005-197612 (published on Jul. 21, 2005) discloses an integrated type quantum wire transistor in which a plurality of silicon nano wires are bound together, and a manufacturing method thereof.

However, the method described in Non-Patent Citation 1 merely makes it possible to simultaneously place the nano wires of one type on the target locations. Meanwhile, Patent Citation 1 does not disclose elements other than the transistor, i.e., elements necessary for actual application as an integrated circuit.

SUMMARY OF THE INVENTION

The present invention is made in view of the foregoing conventional problems, and its object is to provide an integrated circuit device having a substrate on which different types of nano wire having different functions are provided. Another object of the present invention is to render an advanced function to a display device and reduce electric power consumption and manufacturing cost thereof, by using the integrated circuit device of the present invention.

To achieve the objects, an integrated circuit device of the present invention includes an substrate on which a plurality of nano wire elements are provided, the plurality of nano wire elements including at least two types of nano wire element having different functions.

The aforesaid at least two types of nano wire having the different functions are, for example, any combination of an N type electric field effect transistor, a P type electric field effect transistor, a switching element, a diode, a light receiving element, and a light emitting element.

Among the combinations above, for example, consider a case where at least the N type electric field effect transistor and the P type electric field effect transistor are provided on the same substrate. In this case, it is possible to construct a complex logical circuit by combining such basic logical circuits. Further, it is possible to construct a complementary circuit, so that a driving voltage is reduced. Accordingly, the electric power consumption of the integrated circuit device is reduced.

Meanwhile, for example, consider a case where at least the switching element and the light receiving element are provided on the same substrate. In this case, a light receiving function can be rendered to the logical circuit obtained by combining the transistors. The logical circuit thus rendered the light receiving function can be used as a sensor for optical communication between logical circuits.

According to the above structure, it is possible to dramatically improve the function of the integrated circuit device as compared with the integrated circuit device including the nano wires of one type.

To achieve the object, an integrated circuit device of the present invention includes a substrate on which a plurality of nano wire elements are provided, the plurality of nano wire elements including at least two types of nano wire element containing different materials.

The aforesaid at least two types of nano wire containing the different materials are, for example, any combination of an N type electric field effect transistor, a P type electric field effect transistor, a switching element, a diode, a light receiving element, and a light emitting element. Further, the nano wire elements may have different voltage endurance properties.

Various materials can be used for the material for each of the elements to be provided on the substrate. For example, the material for the element may be greatly different from the material for the substrate in terms of lattice constant and thermal expansion coefficient.

Among the combinations above, for example, the aforementioned effect is allowed in cases where at least the N type electric field effect transistor and the P type electric field effect transistor are provided on the same substrate.

Therefore, according to the above structure, it is possible to dramatically improve the function of the integrated circuit device as compared with the integrated circuit device including one type of nano wire.

Additional objects, features, and strengths of the present invention will be made clear by the description below. Further, the advantages of the present invention will be evident from the following explanation in reference to the drawings.

DESCRIPTION OF THE EMBODIMENTS

Figure 1:
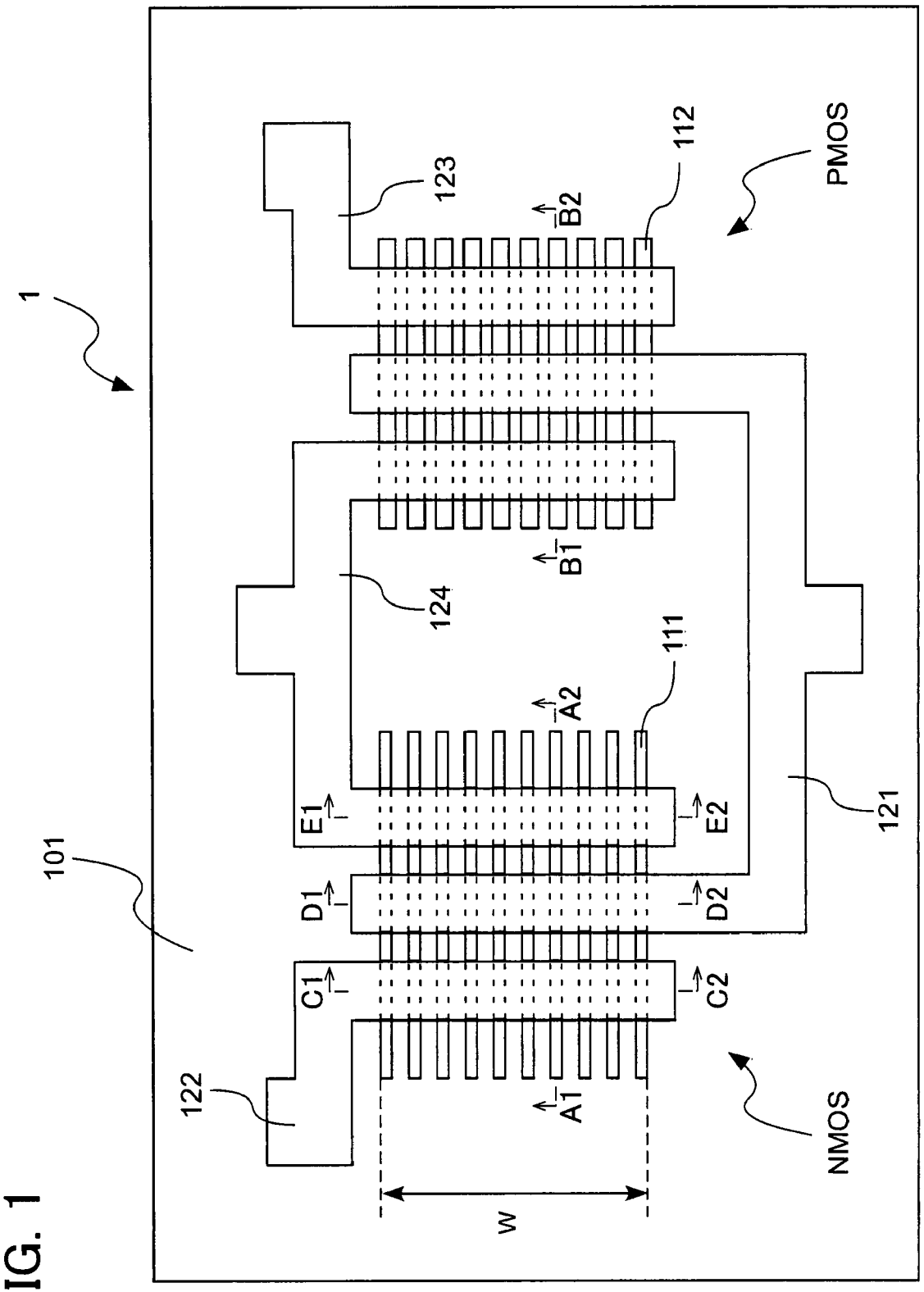
FIG. 1 is a plan view illustrating an example of wiring on a substrate constituting an integrated circuit device according to one embodiment.

An integrated circuit device, of the present invention, using nano wire elements is an integrated circuit device including an substrate on which two or more types of nano wire element are provided, and the nano wire elements have different functions or containing different materials. The nano wire elements having different functions, materials, or properties are formed on the same substrate as such, thereby dramatically improving a function of the integrated circuit device or reducing electric power consumption as compared with the case of integrating nano wire elements of one type. The following explains specific examples of such an integrated circuit device according to the present invention.

In the explanation below, the same reference numeral is rendered to the same member. This holds true for the name and the function of the member. Therefore, detailed explanation therefor will not be repeated.

Embodiment 1

One embodiment of the present invention will be described below with reference to FIG. 1 to FIG. 7. Explained in the present embodiment as a specific example of the integrated circuit devices of the present invention is an integrated circuit device 1 having a substrate 101 on which two nano wire elements having functions different from each other are provided. Of course, the integrated circuit device 1 according to the present invention may be arranged such that three or more elements having different functions from one another are provided on the same substrate.

FIG. 1 is a plan view illustrating wiring on the substrate 101 constituting the integrated circuit device 1. The integrated circuit device 1 of the present embodiment includes an interlayer insulating film 161 (see FIG. 2 to FIG. 6), although the interlayer insulating film 161 is not drawn in FIG. 1 for ease of explanation. The structure of the interlayer insulating film 161 will be explained with reference to FIG. 2 to FIG. 6.

See FIG. 1. On the substrate 101 of the integrated circuit device 1, an N type metal oxide semiconductor field effect transistor (hereinafter, referred to as "NMOS") and a p type metal oxide semiconductor field effect transistor (hereinafter, referred to as "PMOS") are provided as the two nano wire elements having different functions from each other. The elements provided on the substrate 101 of the integrated circuit device 1 may be elements containing different materials.

The NMOS is formed by providing a plurality of nano wires 111 in rows. The PMOS is formed by providing a plurality of nano wires 112 in rows. The nano wires 111 constituting the NMOS, and the nano wires 112 constituting the PMOS share two common wires: a metal wire 121 and a metal wire 124. Further, the nano wires 111 are connected to a metal wire 122, whereas the nano wires 112 are connected to a metal wire 123.

The metal wire 121 is connected to an input terminal of the integrated circuit device 1, and the metal wire 124 is connected to an output terminal thereof. The metal wire 122 is connected to a ground terminal of the integrated circuit device 1, and the metal wire 123 is connected to a power source terminal.

It is preferable that the substrate 101 have an insulative surface. Suitably used as the substrate of the present embodiment are, for example, (i) an insulator, (ii) an semiconductor having a surface on which an insulative film is formed, and (iii) a conductor having a surface on which an insulative film is formed. Further, in cases where the integrated circuit device 1 is supposed to be incorporated in a liquid crystal panel of a display device, it is preferable that the substrate 101 be insulative and transparent. Examples of the substrate 101 include substrates made of materials such as glass and a transparent resin.

Figure 2:
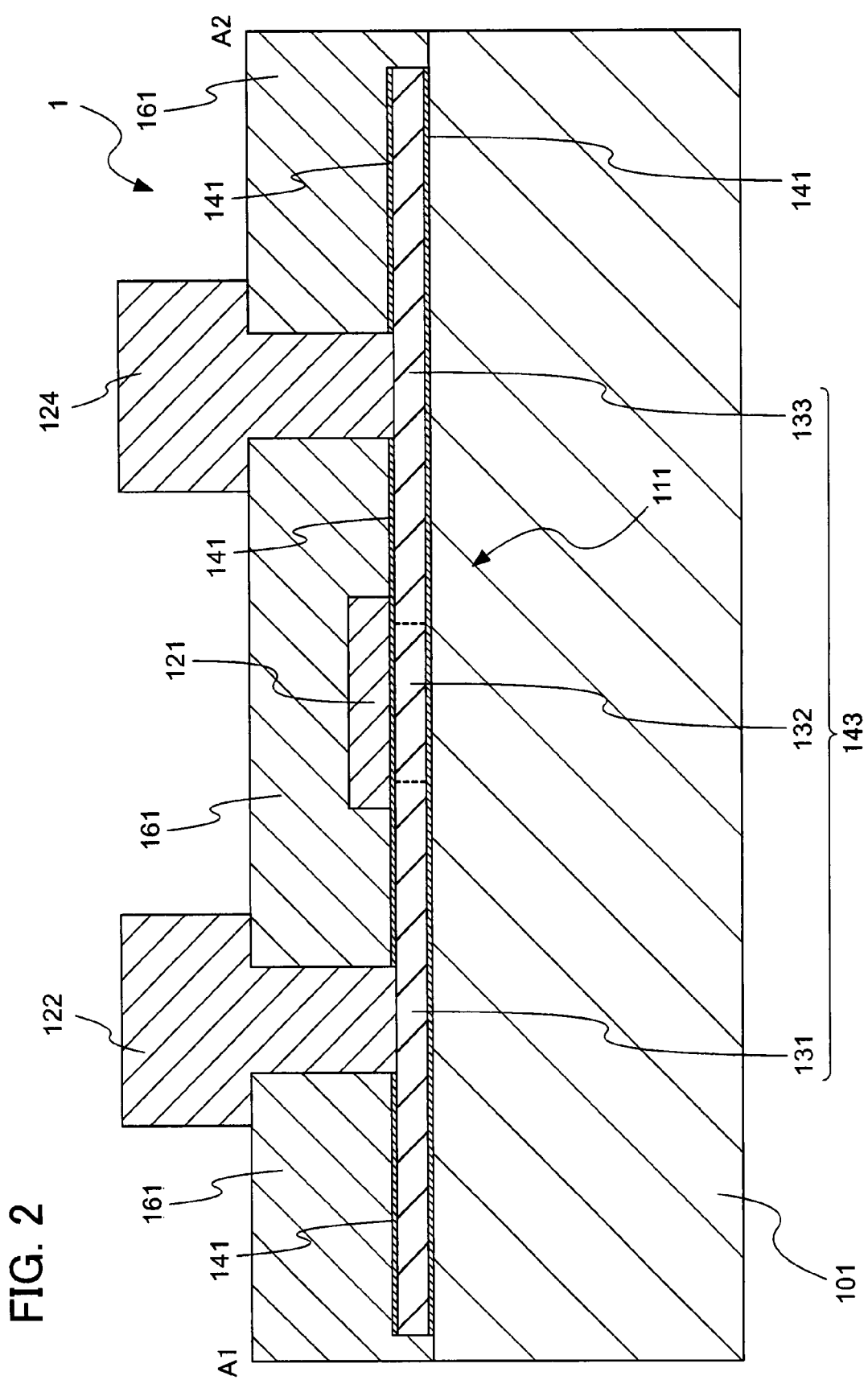
FIG. 2 is a cross sectional view taken along line A1-A2 in cases where an interlayer insulating film is formed in the integrated circuit device shown in FIG. 1.

As described above, the NMOS used in the present embodiment is constructed by providing the plurality of nano wires 111 in rows. Each of the nano wires 111 has a function as an NMOS. The following explains the nano wires 111 used in the present embodiment, with reference to FIG. 2. FIG. 2 illustrates a case where the interlayer insulating film 161 is formed on the integrated circuit device 1 shown in FIG. 1, and is a cross sectional diagram taken along line A1-A2 shown in FIG. 1.

As shown in FIG. 2, the nano wires 11 are provided in rows on the substrate 101. Each of the nano wires 111 is made up of (i) a core 143 having a shape of wire and made from a semiconductor, and (ii) an insulating film 141 covering the core 143. The core 143 has a region 132 having P type conductivity, a region 131 having N type conductivity, and a region 133 having N type conductivity. The insulating film 141 of the nano wire 111 is connected to the metal wire 121. The substrate 101 has an upper surface covered with the interlayer insulating film 161 apart from portions at which the nano wire 111 makes contact with the substrate 101, the metal wire 121, the metal wire 122, and the metal wire 124.

The region 132 is connected to the metal wire 121 via the insulating film 141. The metal wire 121 connected to the input terminal functions as a gate electrode, so that the region 132 functions as a channel region of the nano wire 111. That is, the insulating film 141 covering the region 132 serves as a gate insulating film.

The region 131 of the core 143 and the metal wire 122 are connected to each other. The region 133 of the core 143 and the metal wire 124 are connected to each other. The region 131 thus connected to the metal wire 122 connected to the ground terminal serves as a source region of the nano wire 111. The region 133 thus connected to the metal wire 124 connected to the output terminal serves as a drain region of the nano wire 111.

Figure 3:
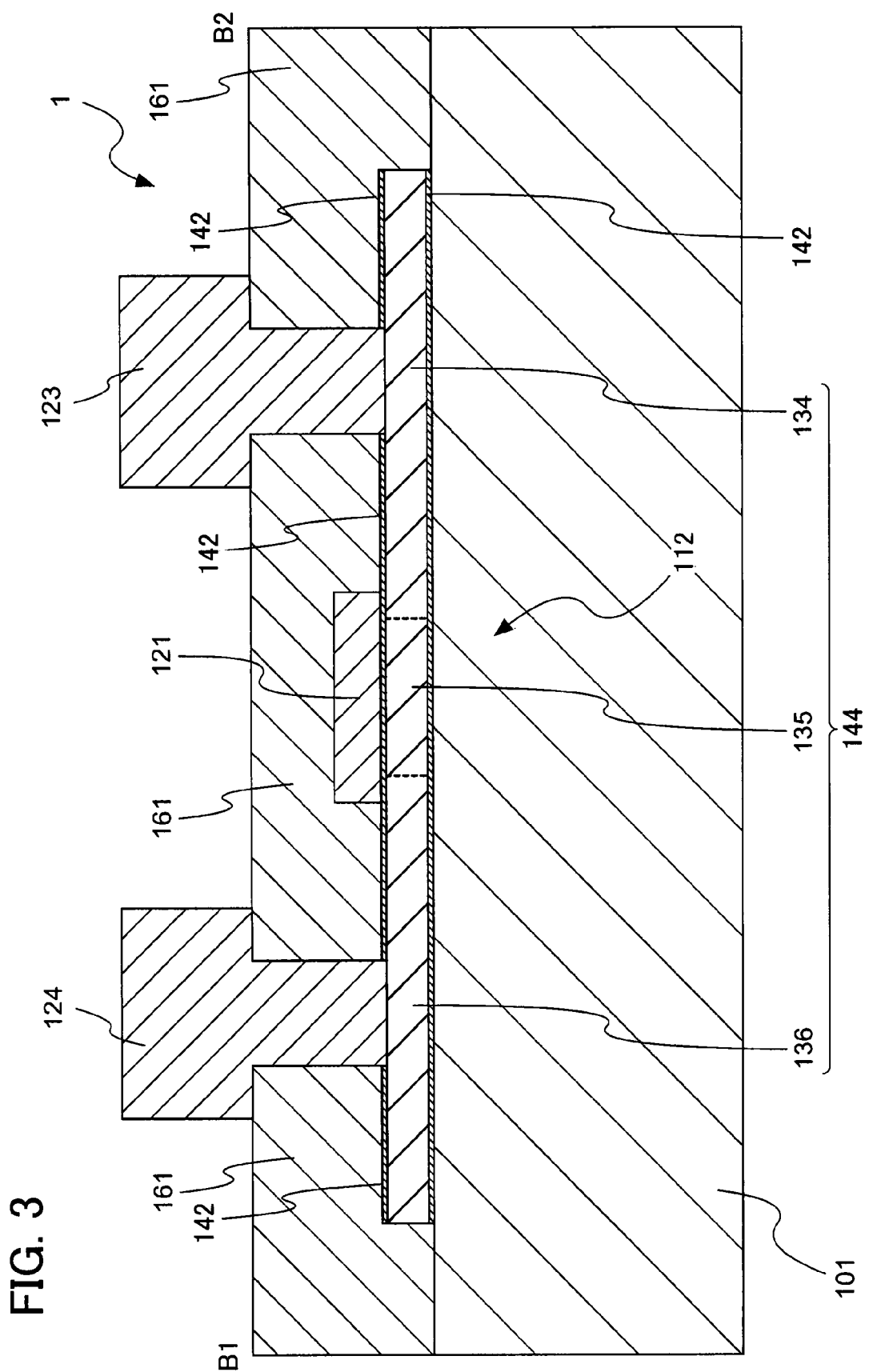
FIG. 3 is a cross sectional view taken along line B1-B2 in cases where the interlayer insulating film is formed in the integrated circuit device shown in FIG. 1.

As is the case with the NMOS, the PMOS used in the present embodiment is constructed by providing the plurality of nano wires 112 in rows. Each of the nano wires 112 has a function as the PMOS. The following explains the nano wires 112 used in the present embodiment, with reference to FIG. 3. FIG. 3 illustrates a case where the interlayer insulating film 161 is formed on the integrated circuit device 1 shown in FIG. 1, and is a cross sectional diagram taken along line B1-B2 shown in FIG. 1.

As shown in FIG. 3, the nano wires 112 are provided in rows on the substrate 101. Each of the nano wires 111 is made up of (i) a core 144 having a shape of wire and made from a semiconductor, and (ii) an insulating film 142 covering the core 144. The core 144 has a region 135 having N type conductivity, a region 134 having P type conductivity, and a region 136 having P type conductivity. On the insulating film 142 of the nano wire 112, the metal wire 121 is formed.

The substrate 101 has an upper surface covered with the interlayer insulating film 161, apart from portions at which the nano wire 112 makes contact with the substrate 101, the metal wire 121, the metal wire 123, and the metal wire 124.

The region 135 is connected to the metal wire 121 via the insulating film 142. The metal wire 121 connected to the input terminal functions as a gate electrode, so that the region 135 functions as a channel region of the nano wire 112.

The core 144 is connected to the metal wire 123 and the metal wire 124. Specifically, the region 134 of the core 144 is connected to the metal wire 123 connected to the power source terminal, thus serving as a source region of the nano wire 112. The region 136 thereof is connected to the metal wire 124 connected to the output terminal, thus serving as a drain region of the nano wire 112. Moreover, the region 136 is connected to the region 133 of the core 143 of the NMOS via the metal wire 124.

In the present embodiment, the interlayer insulating film 161 insulates the substrate 101 from either the nano wire 111 or the nano wire 112. The interlayer insulating film 161 is not particularly limited as long as the interlayer insulating film 161 insulates the metal wire 121, the metal wire 122, and either the metal wire 123 or the metal wire 124 from undesired portions of either the nano wire 111 or the nano wire 112. The interlayer insulating film 161 usable in the present embodiment is made of polyimide resin or the like.

As shown in FIG. 1, FIG. 2, and FIG. 3, the nano wire 111 used in the present embodiment is a nano wire longer than the nano wire 112. The nano wires 111 and the nano wires 112, which are different from each other in their functions, can be provided in rows with ease as such. Namely, in the integrated circuit device 1 of the present embodiment, not less than two types of nano wire element are provided in desired regions on the substrate 101. The lengths of the nano wires may differ depending on their types, and the lengths of the nano wires usable in the present embodiment are not particularly limited.

The region 133 of the core 143 constituting each nano wire 111 serving as the NMOS and the region 136 of the core 144 constituting each nano wire 112 serving as the PMOS are connected to each other via the metal wire 124. Further, the metal wire 121, which is shared by the NMOS and the PMOS, serves as a common gate electrode for the two electric field effect transistors. This allows the NMOS and the PMOS in the present embodiment to be driven in response to supply of one electric signal and exert different functions. Moreover, because the NMOS and the PMOS share the gate electrode, they can be controlled at the same time.

Figure 4:
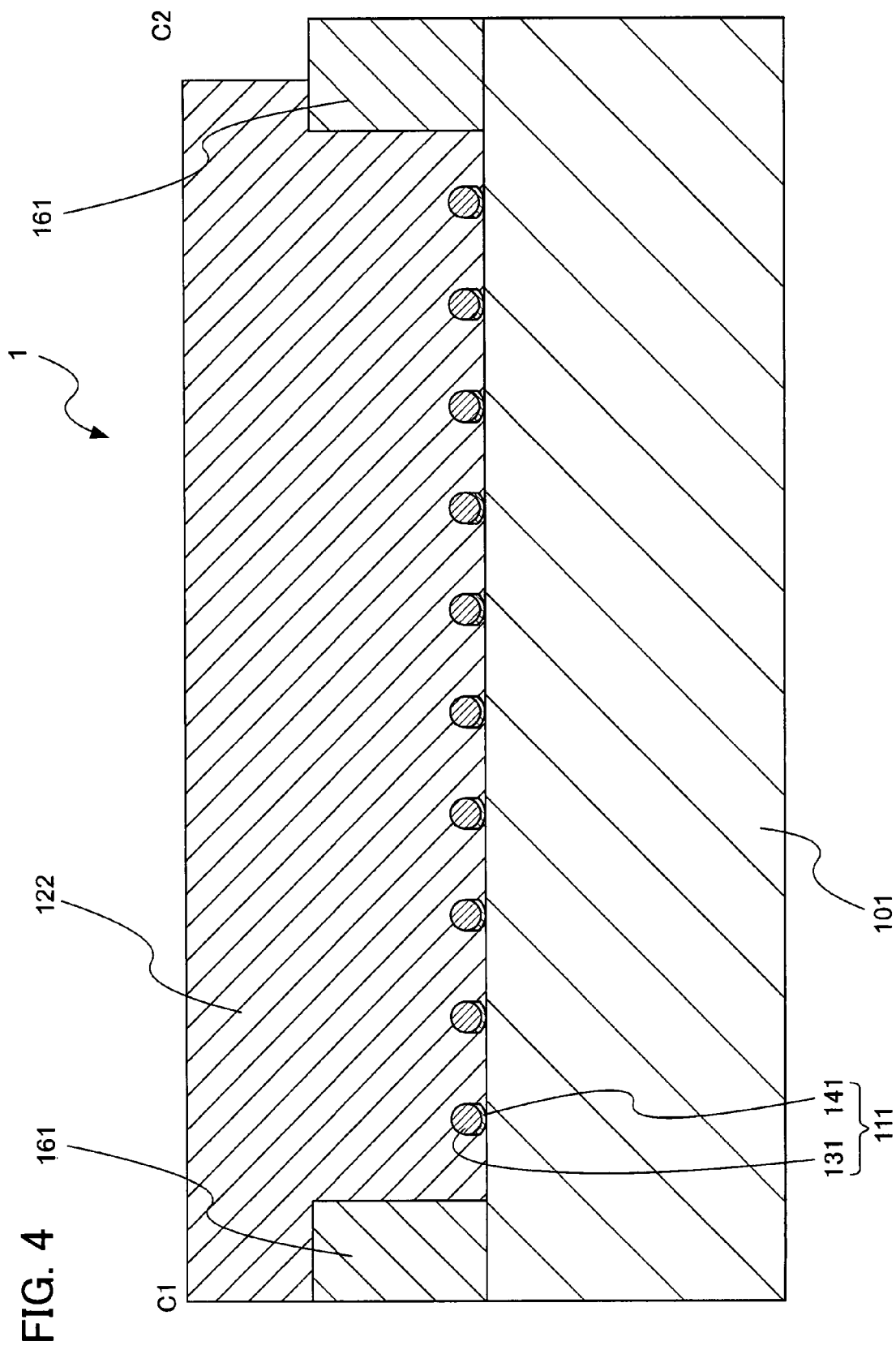
FIG. 4 is a cross sectional view taken along line C1-C2 in cases where the interlayer insulating film is formed in the integrated circuit device shown in FIG. 1.

Further, the nano wire 112 used in the present embodiment is a nano wire having a diameter larger than that of the nano wire 111. A reason of this is as follows. Generally speaking, the PMOS requires a smaller driving current as compared with the NMOS, and therefore uses such a nano wire having a large diameter. This balances the properties that the NMOS and the PMOS have, with the result that the integrated circuit device 1 of the present embodiment exerts its functions stably. FIG. 4 illustrates a case where the interlayer insulating film 161 is formed on the integrated circuit device 1 shown in FIG. 1, and is a cross sectional diagram taken along line C1-C2 shown in FIG. 1.

Figure 5:
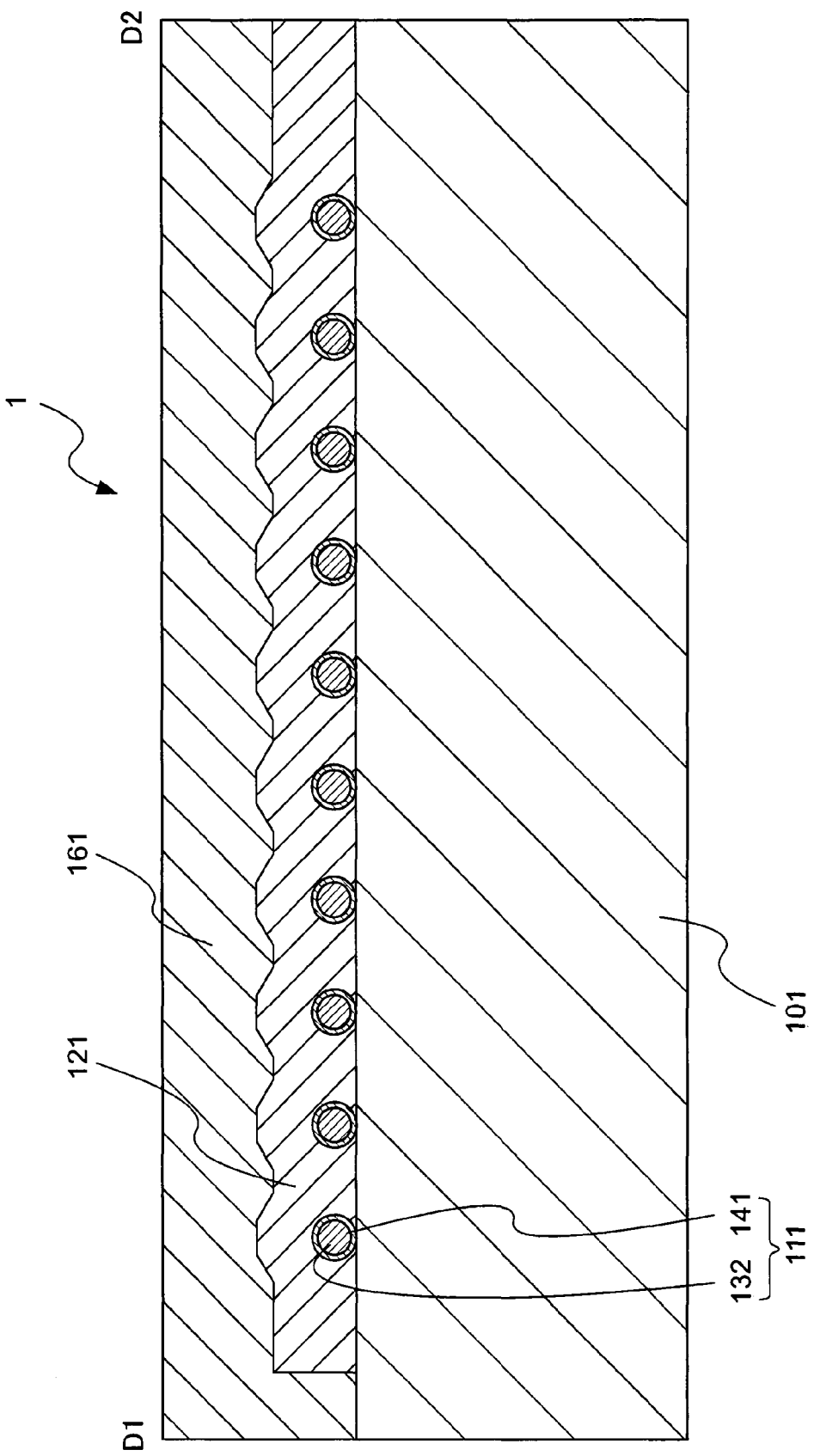
FIG. 5 is a cross sectional view taken along line D1-D2 in cases where the interlayer insulating film is formed in the integrated circuit device shown in FIG. 1.

The core 143 of each nano wire 111 formed on the substrate 101 is insulated from the substrate 101 by the insulating film 141; however, in the core 143, the region 131 connected to the metal wire 122 is not covered with the insulating film 141. The metal wire 122 connected to the region 131 is connected to the ground terminal as described above, so that the region 131 serves as the source region of the NMOS. Further, the metal wire 122 has a part in contact with the substrate 101, but is separated from the substrate 101 by the interlayer insulating film 161 in locations other than the region where the nano wires are provided in rows. FIG. 5 illustrates a case where the interlayer insulating film 161 is formed on the integrated circuit device 1 shown in FIG. 1, and is a cross sectional diagram taken along line D1-D2 shown in FIG. 1.

Figure 6:
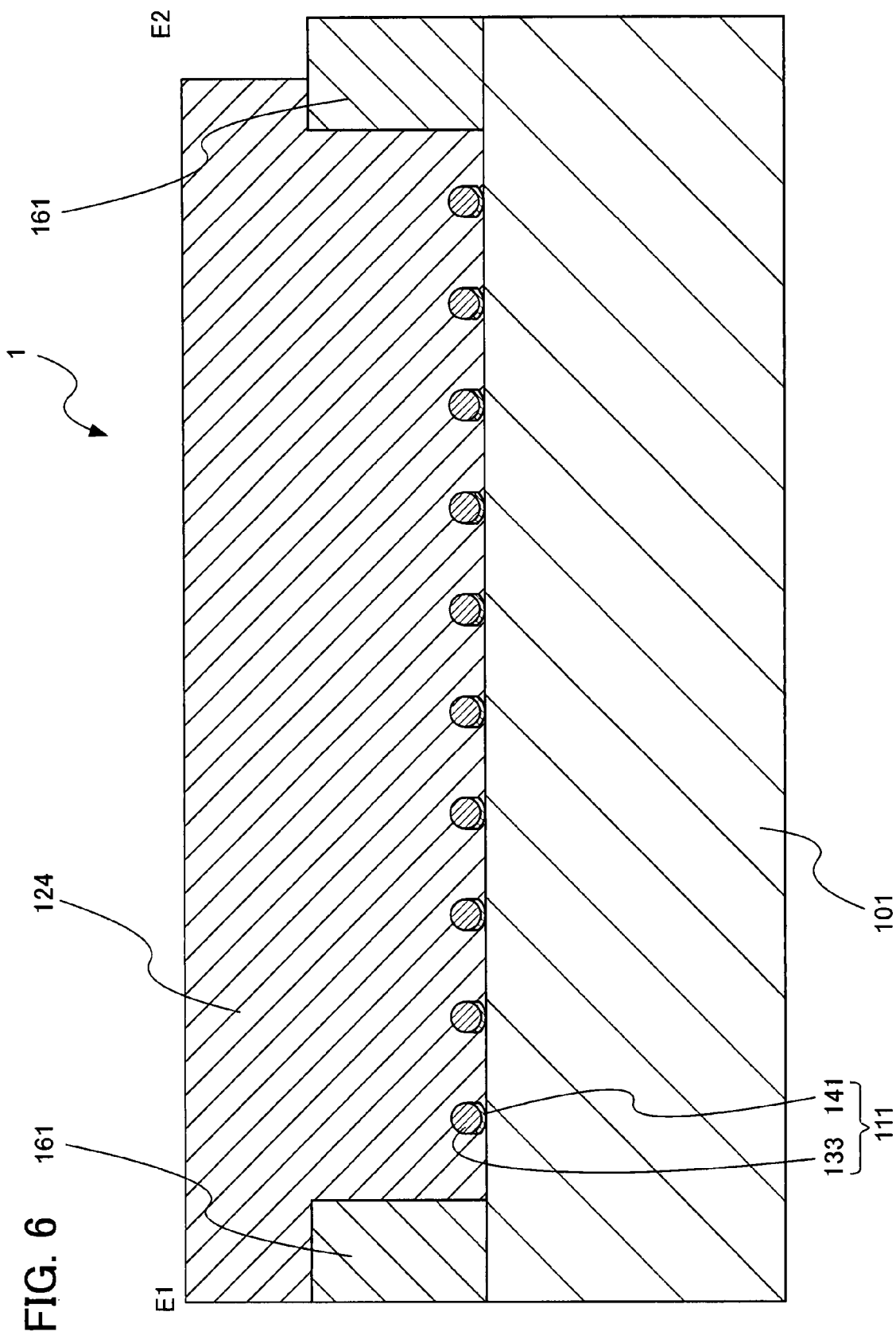
FIG. 6 is a cross sectional view taken along line E1-E2 in cases where the interlayer insulating film is formed in the integrated circuit device shown in FIG. 1.

As described above, the nano wires 111 are formed on the substrate 101, and the core 143 of each nano wire 111 is connected to the metal wire 121 via the insulating film 141. With this, the region 132 of the core 143 serves as the gate region. The metal wire 121 has a part connected to the substrate 101, and is covered with the interlayer insulating film 161. FIG. 6 illustrates a case where the interlayer insulating film 161 is formed on the integrated circuit device 1 shown in FIG. 1, and is a cross sectional diagram taken along line E1-E2 shown in FIG. 1.

The core 143 of each nano wire 111 formed on the substrate 101 is insulated from the substrate 101 by the insulating film 141; however, in the core 143, the region 133 connected to the metal wire 124 is not covered with the insulating film 141. The metal wire 124 connected to the region 133 of the nano wire 111 is connected to the region 136 of the nano wire 112 as described above, so that the region 133 serves as the drain region of the NMOS. Further, the metal wire 124 has a part in contact with the substrate 101, but is separated from the substrate 101 by the interlayer insulating film 161 in locations other than the region where the nano wires are provided in rows.

As shown in FIG. 1, FIG. 4, and FIG. 5, the NMOS is made up of the plurality of nano wires 111, whereas the PMOS is made up of the plurality of nano wires 112. In the present embodiment, each element is thus formed by providing either the plurality of nano wires 111 or the plurality of nano wires 112, for the purpose of (1) holding down fluctuation of a driving current and (2) avoiding insufficiency of a driving current in cases where it is impossible to obtain a sufficient driving current with one nano wire.

In the integrated circuit device 1 according to the present invention, it is preferable that one nano wire element be constituted by 10 to 200 nano wires. For example, assume that the fluctuation of a driving current for one nano wire is 15% and the nano wire element is made up of 10 nano wires. In such a nano wire element, the fluctuation of the driving current is approximately 4.7%. The fluctuation of the driving current is thus below 5%, with the result that sufficient mass production yield ratio is allowed. In other words, in cases where the nano wire element is constituted by not more than 9 nano wires, the fluctuation of the driving current is large, with the result that sufficient mass production yield ratio is not allowed.

Meanwhile, in cases where 200 nano wires each having a diameter of 50 nm are provided in rows with a pitch of 100 nm, the size (W in FIG. 1) of such a nano wire element is 20 µm. The nano wire element is constituted by the nano wires each having such a minute size, and is therefore suitable for use in element downsizing. However, in cases where more than 200 nano wires are provided in rows, the nano wire element has a size of more than 20 µm. If such a nano wire element having too many nano wires is used for a transistor for pixel driving, the device size becomes too large.

Each of the nano wires 111 and 112 used in the present embodiment functions as an electric field effect transistor as described above. Examples of the material for the respective cores 143 and 144 of the nano wires 111 and 112 suitably used for the integrated circuit device 1 of the present invention include: silicon, germanium, silicon germanium, silicon carbide, GaAs, InGaAs, ZnSe, GaN, and the like.

Further, for the insulating films 141 and 142 covering the cores 143 and 144 of the nano wires 111 and 112, it is possible to use (1) insulating films such as a silicon oxide film and a silicon nitride film, and (2) either single layer films made up of highly dielectric films such as an aluminum oxide film, a titanium oxide film, a tantalum oxide film, and a hafnium oxide film, or a film stack made up of the highly dielectric films.

The material for the gate electrode 121 is not particularly limited as long as the material is one normally used in the integrated circuit device 1. Examples of the material include: (1) a conductive film such as polysilicon, (2) metals such as copper and aluminum, (3) high melting point metal such as tungsten, titanium, and tantalum, and (4) either a single layer film made of a high melting point metal and silicide etc., or a film stack made of a high melting point metal and silicide etc, and the like.

When the nano wires 111 and 112 are used for transistors, the cores 143 and 144 of the nano wires 111 and 112 are connected to the gate electrode 121 via the insulating film (143 and 144), with the result that inversion layers are respectively formed in the outermost layers of the regions 132 and 135 of the cores 143 and 144 connected to the gate electrode 121. The formation of the inversion layers allows the regions 132 and 135 of the cores 143 and 144 to serve as a channel.

Therefore, a driving current for each of the nano wires 111 and 112 serving as transistors is in proportion to the circumferential length ($\pi R$ where the diameter of the core is R) of the cross sectional surface of the cores 143 and 144. Therefore, in cases where each of the nano wires 111 and 112 is used for a transistor, it is preferable that each of the diameters of the cores 143 and 144 of the nano wires 111 and 112 be in the range from 5 nm to 100 nm.

When the diameter of each of the nano wires 111 and 112 is shorter than 5 nm, a driving current for each of the nano wires 111 and 112 is very small. This increases fluctuations of respective driving currents for the nano wires 111 and 112 constituting the transistors. As a result, it cannot be expected that the element does not operate stably even in cases where the elements are constructed by providing the plurality of nano wires 111 and the plurality of nano wires 112, respectively.

Meanwhile, when each of the diameters of the nano wires 111 and 112 is longer than 100 nm, the outermost layers in the regions 132 and 135 of the cores 143 and 144 connected to the gate electrode are less likely to be depleted completely. In cases where the outermost layers of the regions 132 and 135 connected to the gate electrode 121 are not depleted completely, benefits of the transistors using the nano wires 111 and 112 are flawed. A specific example of such benefits is deterioration of the subthreshold property of the transistor.

Note that the members constituting each element of the integrated circuit device 1 of the present invention are not limited to the nano wires 111 and 112, but may be anything. Each of the members constituting each element may be made up of a conductor having a wire-like outer shape and an insulator covering the conductor, and functions as the element. An example of such a member is a so-called nano tube which uses a hollow conductor in place of each of the cores 143 and 144 of the nano wires 111 and 112.

Figure 7:
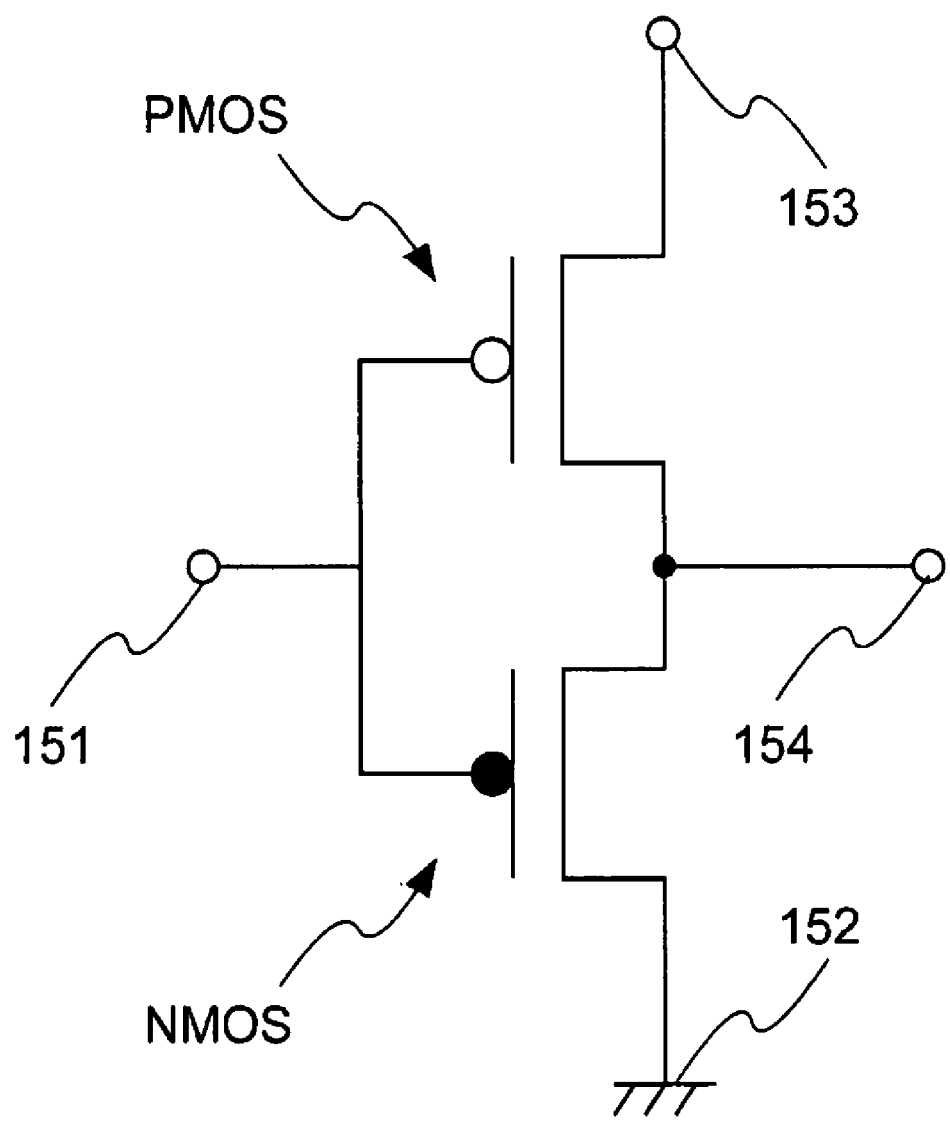
FIG. 7 is a circuit diagram of a circuit constituting the integrated circuit device shown in FIG. 1.

The following explains a circuit of the integrated circuit device 1 shown in FIG. 1. FIG. 7 is a circuit diagram illustrating the structure of the circuit of integrated circuit device 1. As shown in FIG. 7, the integrated circuit device 1 of the present embodiment is an inverter circuit constituted by the NMOS and the PMOS. Correlations between the circuit diagram of FIG. 1 and the wiring diagram of FIG. 1 are as follows.

The input terminal 153 is connected to the metal wire 121. The ground terminal 152 is connected to the metal wire 122. The power source terminal 153 is connected to the metal wire 123. The output terminal 154 is connected to the metal wire 124.

In the present embodiment, the inverter circuit (NOT circuit) is described as the specific example of the combination of the NMOS and the PMOS. However, this is not only the circuit that can be constructed by combining the nano wire elements according to the present invention. It is possible to construct an AND circuit, an NAND circuit, an NOR circuit, an XOR circuit, and the like. Moreover, it is possible to construct a more complex logical circuit by combining these circuits.

As described above, the integrated circuit device 1 of the present embodiment includes the two nano wire elements (the NMOS and the PMOS), which are provided on the substrate and have different functions. This makes it possible to construct a complex logical circuit by combining basic logical circuits. Further, it is possible to construct a complementary circuit, so that a driving voltage is reduced and electric power consumption in the integrated circuit device 1 is accordingly reduced. In other words, the function of the integrated circuit device 1 is improved dramatically, as compared with that of an integrated circuit device having a substrate on which nano wire elements of only one type are provided.

Embodiment 2

Another embodiment of the present invention will be described below with reference to FIG. 8 to FIG. 10. Explained in the present embodiment as a specific example of an integrated circuit device 2 of the present invention is an integrated circuit device 2 having a substrate 101 on which two nano wire elements having functions different from each other are provided. Of course, the integrated circuit device 2 of the present invention may be arranged such that three or more elements having different functions from one another are provided on the substrate 101.

Figure 8:
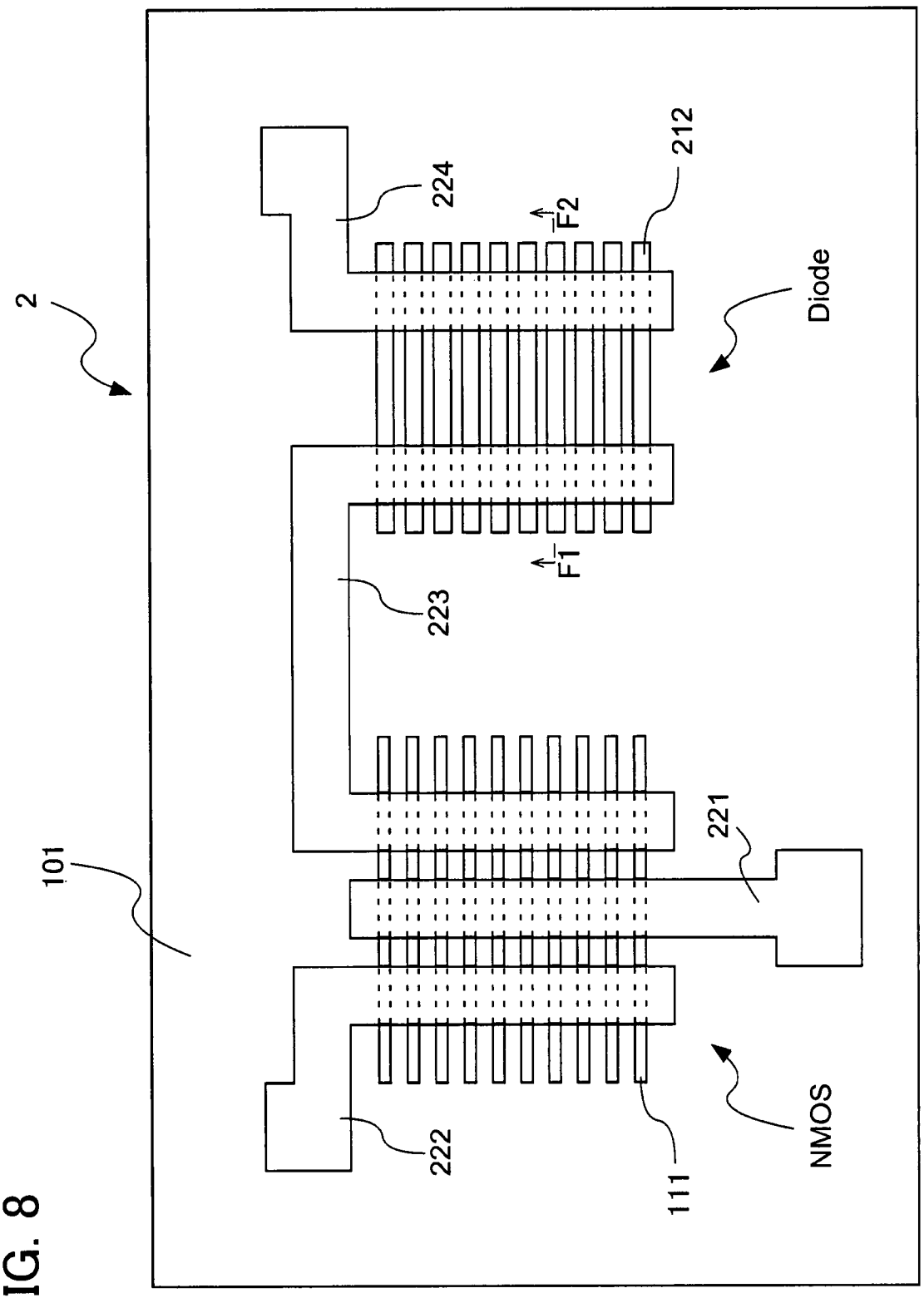
FIG. 8 is a plan view illustrating an example of wiring on a substrate constituting an integrated circuit device according to another embodiment.

FIG. 8 is a plan view illustrating wiring on the substrate 108 constituting the integrated circuit device 2 according to the present invention. The integrated circuit device 2 of the present embodiment includes an interlayer insulating film 161 (see FIG. 9), although the interlayer insulating film 161 is not drawn in FIG. 8 for the same reason as FIG. 1.

See FIG. 8. The integrated circuit device 2 includes a substrate 101 on which the two nano wire elements, an NMOS and a diode (see "Diode" of FIG. 8), are provided. Instead of the NMOS, a PMOS may be provided on the substrate 101 of the integrated circuit device 2. Alternatively, three or more elements may be provided thereon. Further, the elements provided on the substrate 101 of the integrated circuit 2 may be elements having different functions and/or containing different materials.

The NMOS is the same one as the NMOS described in Embodiment 1. The diode is formed by providing a plurality of nano wires 212 in rows. As shown in FIG. 8, each of the nano wires 111 is longer than each of the nano wires 212. Such nano wires 111 and 212 can be provided with ease in rows in desired regions on the substrate 101. Further, as described in Embodiment 1, the lengths of the nano wires 111 and 212 usable in the present embodiment are not limited.

Each of the two nano wire elements is made up of 10 nano wires 111 and 212, but may be made up of 10 or more nano wires 111 and 212. It is preferable that the nano wire element used in the integrated circuit device 2 of the present invention be constituted by 10 to 200 nano wires 111 or 212. A reason for this is described in Embodiment 1.

As is the case with the structure shown in FIG. 2, a metal wire 222 is connected to an input terminal of the integrated circuit device 2 and is connected to the region 131 of each nano wire 111. A metal wire 221 serves as a gate electrode of the NMOS, and is connected to the region 132 of the nano wire 111. The nano wire 111 and the nano wire 212 share a metal wire 223, which is a common wire for them. Therefore, the NMOS, which is a switching element, can control the function of the diode. A metal wire 224 is connected to an output terminal of the integrated circuit device 2 and is connected to the nano wire 212.

Figure 9:
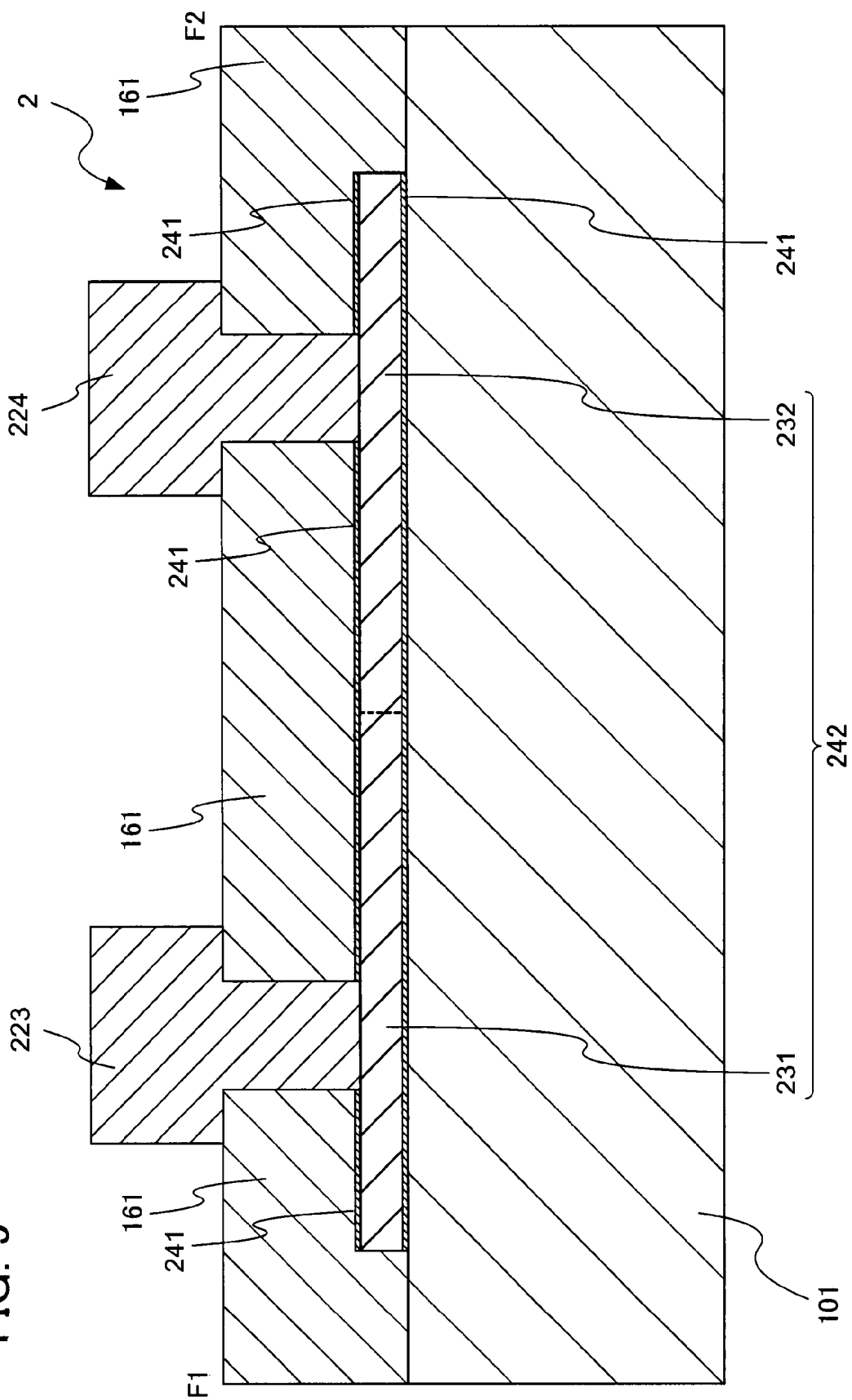
FIG. 9 is a cross sectional view taken along line F1-F2 in cases where an interlayer insulating film is formed in the integrated circuit device shown in FIG. 8.

The following explains the nano wires 212 constituting the diode used in the present embodiment, with reference to FIG. 9. FIG. 9 illustrates a case where the interlayer insulating film 161 is formed on the integrated circuit device 2 shown in FIG. 8, and is a cross sectional diagram taken along line F1-F2 shown in FIG. 8.

Each of the nano wires 212 provided in rows on the substrate 101 is made up of (i) a core 242 having a shape of wire and made from a semiconductor, and (ii) an insulating film 241 covering the core 242. The core 242 has a region 231 having P type conductivity, and a region 232 having N type conductivity. That is, the region 231 provided in the core 242 serves as an anode region, and the region 232 serves as a cathode region. In this way, each nano wire 212 serves as a diode. Further, as described above, the region 231 is connected to the NMOS via the metal wire 223. Further, the region 232 is connected to the metal wire 224.

In the integrated circuit device 2, the NMOS and the diode are provided on the same substrate 101. Examples of the diode include: (i) a diode serving as a rectifying element, (ii) a light emitting diode (LED) serving as a light emitting element, (iii) a photo diode serving as a light receiving element, and the like. Among these diodes, it is preferable that the diode herein be the light emitting diode or the photo diode.

Figure 10:
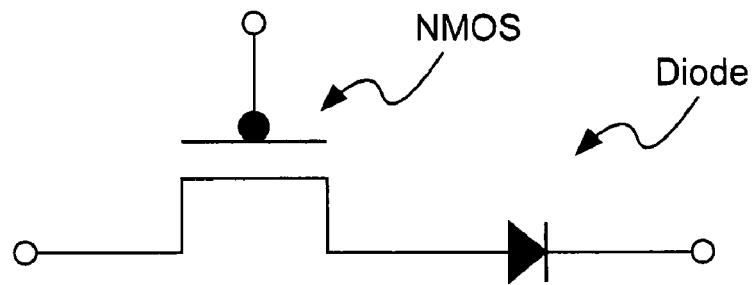
FIG. 10(a) is a circuit diagram of a circuit constituting the integrated circuit device shown in FIG. 8.
FIG. 10(b) is a circuit diagram illustrating a modified example of the circuit shown in FIG. 10(a).
FIG. 10(c) is a circuit diagram illustrating another modified example of the circuit shown in FIG. 10(a).
Figure 10:
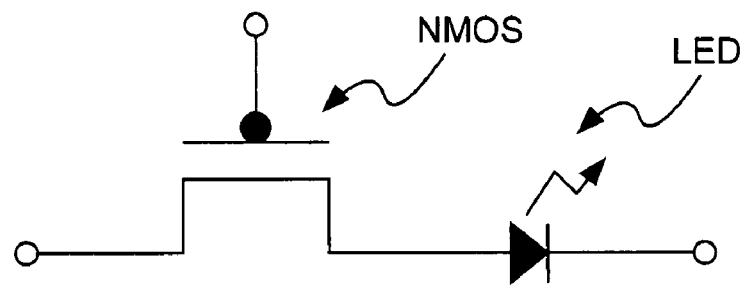
Figure 10:
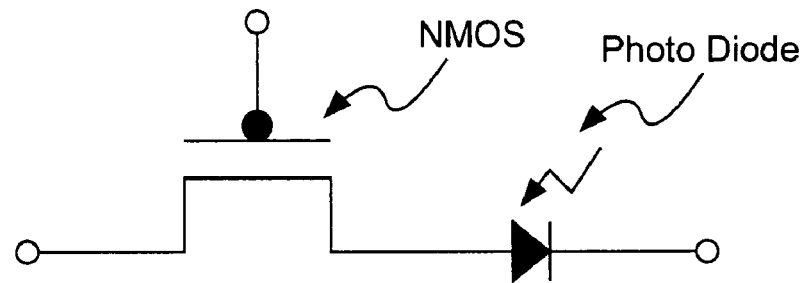

Each of FIG. 10 is a circuit diagram illustrating a circuit constructed by combining any one of the above-exemplified three diodes with the NMOS.

Examples of a material for the core 242 of each nano wire 212 constituting the diode serving as the rectifying element include: silicon, germanium, silicon germanium, and the like. By forming the core 242 of the nano wire 212 with the use of each of these materials, it is possible to manufacture the integrated circuit device 2 including the circuit shown in FIG. 10(a).

FIG. 10(b) illustrates a circuit, which is a part of the integrated circuit device 2 having the substrate on which the NMOS serving as the switching element and the light emitting diode serving as the light emitting element are provided.

Examples of a material for the nano wire suitably usable in the integrated circuit device 2 of the present embodiment and having the function as the light emitting diode include: GaAs, GaSb, InP, InAs, InSb, AlGaInP, GaN, InGaN, and the like.

FIG. 9 illustrates the case where the P type region 231 and the N type region 232 make a PN homojunction. However, the PN junction therebetween is not limited to the PN homojunction. In cases where the nano wire element is used as the light emitting diode, the anode region and the cathode region of the core 242 may make a single heterojunction or double heterojucntion, each of which allows better light emitting efficiency. Further, each nano wire 212 having the function as the light emitting diode may have a light emitting layer having either a quantum well structure or a multiquantum well structure.

FIG. 10(c) illustrates a circuit, which is a part of the integrated circuit device 2 having the substrate 101 on which the NMOS serving as the switching element and the photo diode serving as the light receiving element are provided.

Examples of a material for each nano wire 212 suitably usable in the integrated circuit device 2 of the present embodiment and having the function as the photo diode include: silicon, GaAsP, GaP, and the like. FIG. 9 illustrates the case of the simple PN junction as described above. However, the anode region and the cathode region of the core 242 may make a PIN junction in cases where the nano wire element is used as the photo diode.

In cases where the light receiving element is constructed by using the nano wire 212, the anode region and the cathode region of the core 242 do not need to make PN junction. Instead, a photoconductive effect may be utilized for the junction therebetween. In the case where the photoconductive effect is utilized, the core 242 of the nano wire 212 is made of, e.g., silicon, CdS, CdSe, PbSe, PbTe, InSb, or the like.

In cases where the switching element and the light emitting element are provided on the same substrate 101, it is possible to render a light emitting function to the logical circuit constructed by combining the transistors. For example, the use of the light emitting function for a light emitting source of a display device allows realization of a display device having a display panel in which a logical circuit and a light emitting pixel are provided.

In cases where the switching element and the light receiving element are provided on the same substrate 101, it is possible to render a light receiving function to the logical circuit constructed by combining the transistors. This makes it possible to, e.g., carry out optical communication between (i) the logical circuit in which the light receiving element is provided and (ii) the aforementioned logical circuit on which the light emitting element is provided. The light receiving element may be used as a sensor.

The description thus far has explained the integrated circuit device 2 having the substrate 101 on which the switching element and the diode are provided. It is difficult to form a switching element and a light emitting element on the same substrate in accordance with the conventional techniques. There are the following three reasons for this:

(1) Although silicon is suitable for the material of the substrate of the integrate circuit device, it is impossible to form the light emitting element from single crystal silicon.

(2) A material suitable for the formation of the light emitting element is not suitable for the substrate of the integrated circuit device more than silicon.

(3) In the case of growing, on the substrate, an epitaxial layer made of a material whose physical property constants such as lattice constant and thermal expansion coefficient are greatly different from those of the substrate, the epitaxial layer has a high-density crystal defect. This results in deterioration of the property of the device and deterioration with age.

In order to solve the above problem (3), a research has been conducted for a technique of reducing the crystal defect by providing an intermediate layer between the substrate and the epitaxial layer. However, in the integrated circuit device 2 according to the present invention, the nano wire element and the substrate 101 are manufactured independently, so that steps of manufacturing the integrated circuit device 2 are never increased but a plurality of elements containing a material different from that of the substrate 101 can be provided on the substrate 101.

As described above, in the integrated circuit device 2 of the present embodiment, the two types of nano wire element (the electric field effect transistor and any one of the rectifying element, the light emitting element, or the light receiving element) having different functions are provided on the same substrate 101. This dramatically improves the function of the integrated circuit device 2 as compared with the conventional integrated circuit device. Also, it is possible to simultaneously realize downsizing of the integrated circuit device 2 and cost reduction thereof.

Explained in the present embodiment is the integrated circuit device 2 having the substrate 101 on which the two types of nano wire having different functions and/or containing different materials are provided. However, the present invention is not limited to this. According to the present invention, one or more nano wire elements having different functions and/or containing different materials may be further provided in the integrated circuit device 2 of the present embodiment.

Embodiment 3

Figure 11:
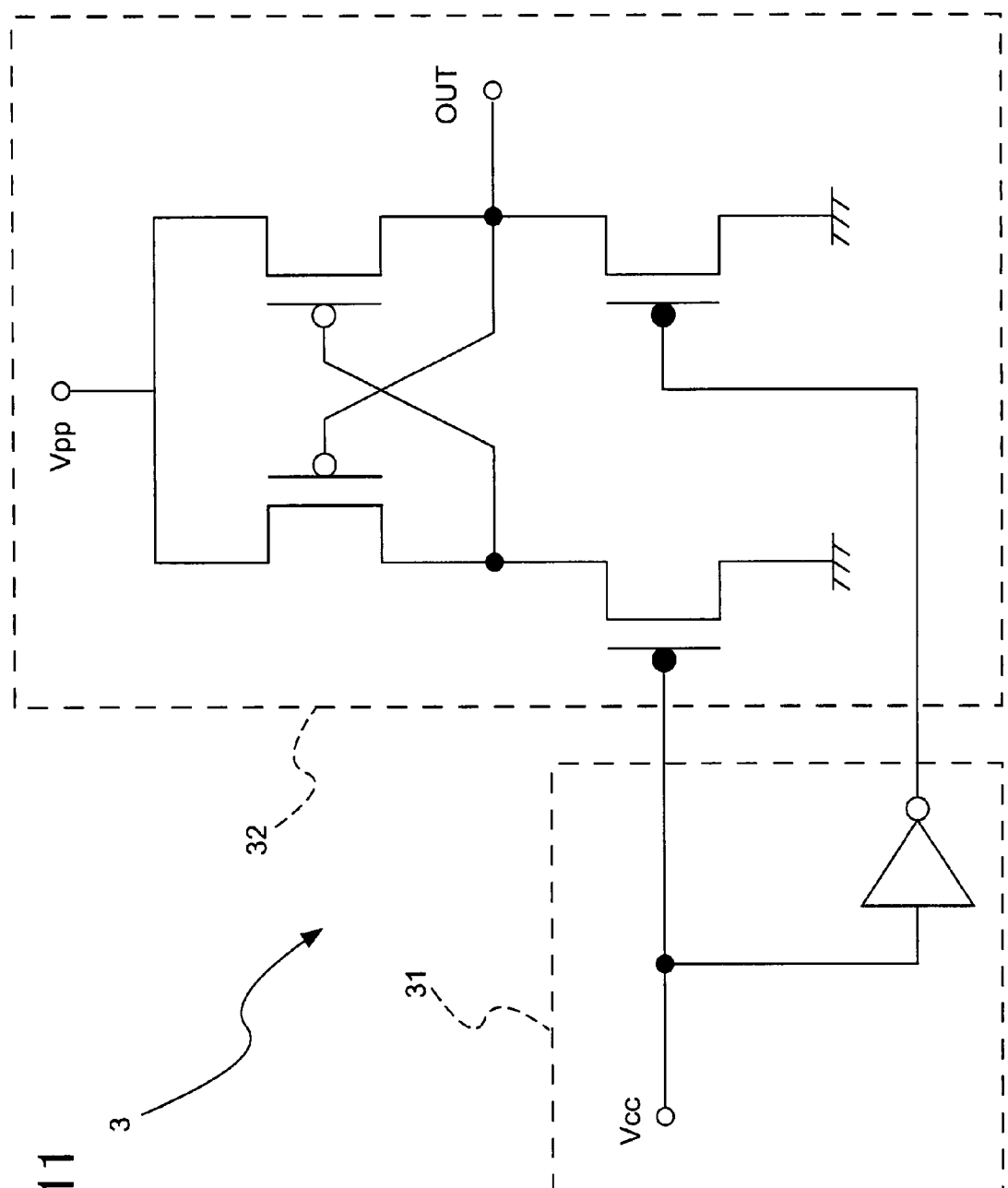
FIG. 11 is a circuit diagram of a level shifter constituting an integrated circuit device according to the present invention.

The following explains a case where an integrated circuit device of the present invention includes a level shifter, with reference to FIG. 11. The level shifter 3, which constitutes the integrated circuit device of the present embodiment, can be manufactured by combining the NMOS and the PMOS serving as the nano wire elements. FIG. 11 is a circuit diagram of the level shifter 3 provided in the integrated circuit device of the present embodiment.

See FIG. 11. When the level shifter 3 receives an input low voltage (Vcc) from its input terminal, the level shifter 3 outputs an output high voltage (Vpp) from its output terminal (OUT). Each element shown in FIG. 11 is constituted by a nano wire element. The level shifter 3 includes a low voltage circuit section 31, which is driven by a low voltage, and a high voltage circuit 32, which is driven by a high voltage.

The low voltage circuit section 31 and the high voltage circuit section 32 are driven by different voltages as described above. For this reason, it is preferable that the nano wire element for the low voltage circuit section 31 and the nano wire element for the high voltage circuit section 32 be constituted by nano wires having different voltage endurance properties, respectively. Specifically, it is preferable that the nano wire element provided in the low voltage circuit section 31 be constituted by a nano wire which has relatively low voltage endurance, is excellent in driving ability, and can be miniaturized, for example. On the other hand, it is preferable that the nano wire element provided in the high voltage circuit section 32 is constituted by a nano wire having high voltage endurance, for example.

For example, it is preferable that the core of the nano wire provided in the low voltage circuit section 31 be made of a material such as Si, or GaAs. The core of the nano wire provided in the high voltage circuit section 32 be made of a material such as SiC.

Further, the following method may be further adopted for the purpose of rendering high voltage endurance to the nano wire: either (i) a method of lengthening the gate length of the nano wire, or (ii) a method of relaxing electric field by providing an LDD (Lightly Doped Drain) in the PN junction.

The level shifter 3 of the present embodiment is applicable to a display device having a logical circuit section for carrying out image processing or the like. In such a display device, generally, a voltage higher than a driving voltage for the logical circuit section is required in driving a pixel section. The level shifter converts (i) the low voltage driving signal sent from the logical circuit section, into (ii) the high voltage driving signal. This allows the pixel section to be driven. For the same reason, such a level shifter 3 needs to be provided for the sake of driving a memory.

The description thus far has explained the integrated circuit device having the substrate on which the plurality of nano wire elements having such different voltage endurance properties are provided. In the present embodiment, the elements having the different voltage endurance properties are constituted by the nano wires made from different materials.

As described in Embodiment 2, it is difficult to form, on the same substrate in accordance with the conventional techniques, a plurality of elements from different materials. However, according to the present invention, the nano wire element and the substrate can be manufactured independently, so that manufacturing steps are never increased but a plurality of elements containing different materials can be provided on the substrate.

As described above, the integrated circuit device of the present embodiment includes the substrate on which the two types of nano wire element (the low voltage endurance nano wire and the high voltage endurance nano wire element) are provided. This dramatically improves the function of the integrated circuit device.

Explained in the present embodiment is the integrated circuit device having the substrate on which the two types of nano wire containing different materials and having different properties. However, the present invention is not limited to this. According to the present invention, one or more nano wire elements having different functions described in this specification and/or containing different materials may be further provided in the integrated circuit device of the present embodiment.

Embodiment 4

Explained in the present embodiment are steps in a method for manufacturing the integrated circuit device 1, with reference to FIG. 12 to FIG. 17. Specifically, the following explains steps of selectively providing, on the substrate 101, the various types of nano wire element having different functions, containing different materials, and/or having different properties. Note that each nano wire 111 has a size (length) different from that of each nano wire 112, as described above.

Each of the nano wires 111 and 112 used in the present embodiment can be manufactured in accordance with a conventional and publicly known method, such as the method described in Japanese Unexamined Patent Publication Tokukai 2005-197612 mentioned above). It is only necessary to prepare nano wires 111 and 112 having desired lengths and thicknesses, so that whether to carry out the step of manufacturing the nano wires is not an essential matter in the manufacturing method according to the present invention.

Figure 12:
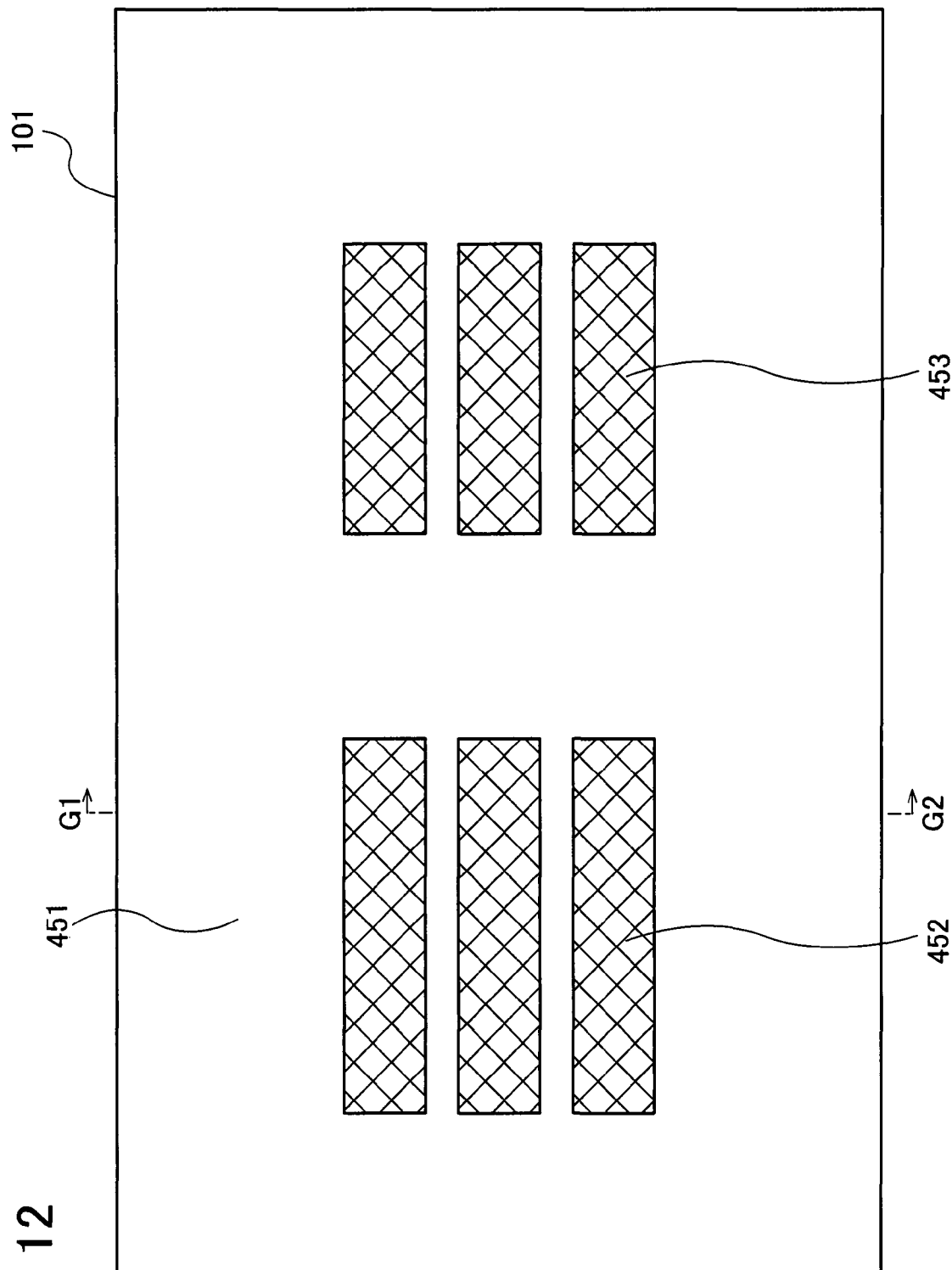
FIG. 12 is a plan view illustrating a step of forming placement regions for nano wires, in a method for manufacturing the integrated circuit device according to the present invention.

FIG. 12 is a plan view illustrating a step of carrying out pretreatment with respect to the substrate 101 before providing the nano wires 111 and 112 in rows. The pretreatment is patterning of a plurality of regions in which the nano wires 111 and 112 are to be provided in rows. Such regions are, e.g., placement regions 452 and placement regions 453. Each of the regions is patterned such that either the nano wires 111 or 112 of one type are to be selectively provided therein in rows. For example, each of the placement regions 452 is patterned on the substrate in the form of a rectangle whose longitudinal side has a length corresponding to the length of each of the nano wires 111. Meanwhile, for example, each of the placement regions 453 is patterned on the substrate in the form of a rectangle whose longitudinal side has a length corresponding to the length of each of the nano wires 112.

In the present embodiment, the placement regions 452 and 453 for selectively providing the nano wires 111 and 112 therein in rows are patterned as the rectangular regions on the substrate 101. However, the placement regions 452 and 453 may respectively have any shapes allowing desired nano wires 111 and 112 to be provided therein in rows selectively, so that the shapes thereof may be arbitrarily changed according to the sizes, etc., of the nano wires 111 and 112. A region other than the placement regions 452 and 453 on the surface of the substrate 101 is a non-placement region 451. By forming the placement regions 452 and 453 and the non-placement region 451, it is possible to selectively provide the nano wires 111 and 112 in rows on desired regions.

Explained in the present embodiment is the case where the two types of nano wire 111 and 112 are provided in the desired regions on the substrate 101 in rows. Hence, there are two sizes for the placement regions 452 and 453, respectively. The types of size for the placement regions may be increased according to the types of nano wire to be provided in rows.

Figure 13:
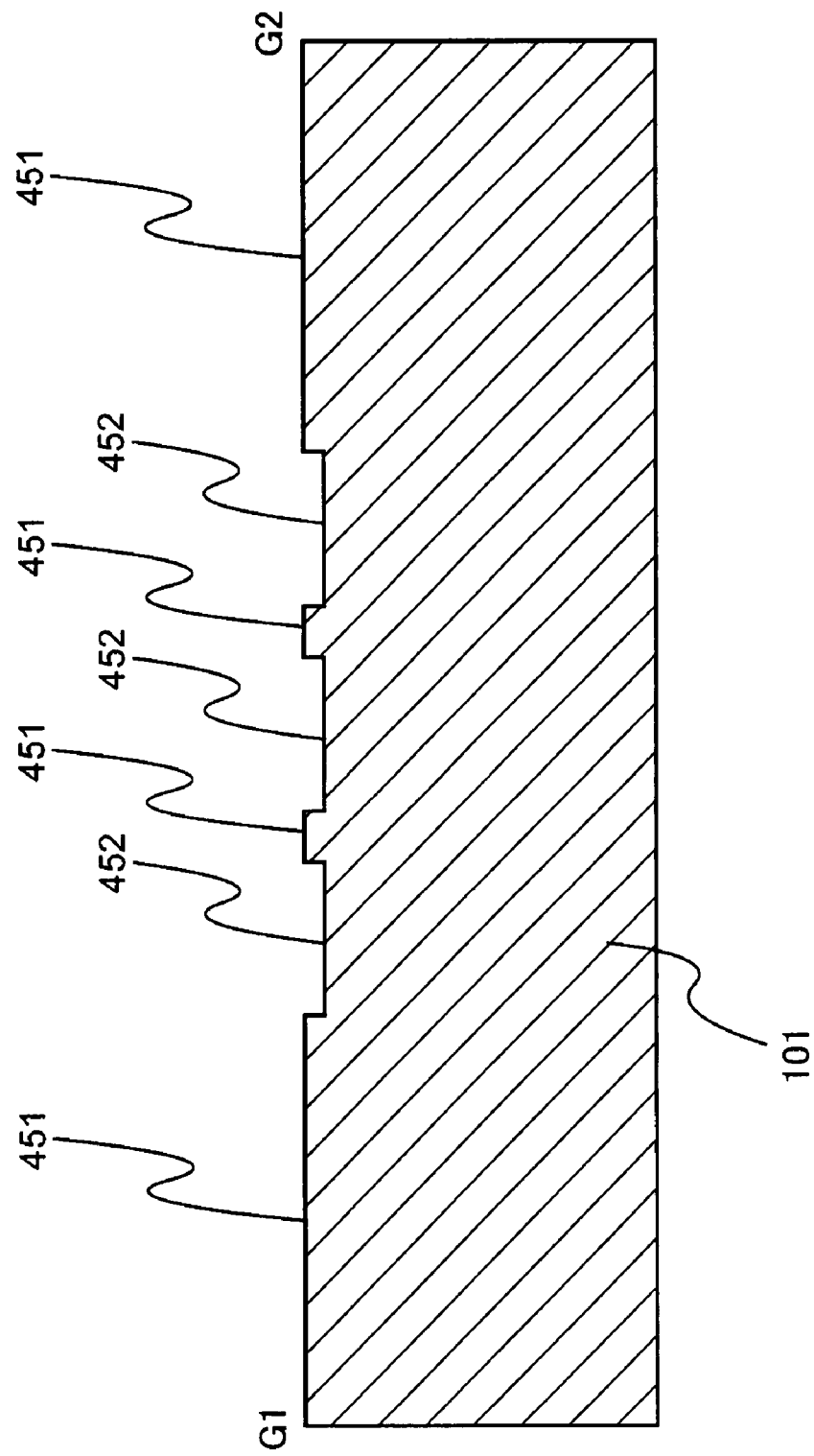
FIG. 13 is a cross sectional view taken along line G1-G2 shown in FIG. 12.

The patterning of the substrate 101 is carried out by, e.g., etching the substrate 101 so as to form the placement regions 452 and 453 in a recess manner (recess shapes) as shown in FIG. 13, which is a cross sectional view taken along line G1-G2 of FIG. 12. After the etching for the placement regions 452 and 453, the nano wires 111 and nano wires 112 are scattered on the substrate 101. This makes it possible to selectively provide the nano wires 111 on the placement regions 452, and the nano wires 112 on the placement region 453.

The following method can be exemplified as a method of providing the nano wires 111 and 112 in rows, in the manufacturing method of the integrated circuit device 1 according to the present invention. For example, after the patterning step, solvents in which the nano wires 111 and 112 are respectively dispersed are applied to the substrate 101. In this method, the placement regions 452 and 453 are respectively rendered lyophilic properties for the solvents, and the non-placement region 451 is rendered a lyophobic property against the solvents. Hereinafter, this method is referred to as "method of rendering lyophilic and lyophobic properties to the substrate 101".

With the use of the above method, the placement regions 452 and 453 are likely to catch the solvents in which the nano wires 111 and 112 are dispersed, respectively, but the non-placement region 451 repels the solvents. Hence, the nano wires 111 and 112 are provided in rows more selectively in the placement regions 452 and 453.

The lyophilic and lyophobic properties can be rendered to the substrate 101 by, e.g., forming (patterning) an organic film on the non-placement region 451 and carrying out a plasma process so as to render the lyophobic property to the organic film. In the case of rendering the properties in this way, examples of the solvents in which the nano wires 111 and 112 are respectively dispersed include: water, alcohols such as isopropyl alcohol, a compound liquid of water and an alcohol, and the like.

Further, the method of patterning using the etching, and the method of rendering the lyophilic and lyophilic properties to the substrate 101 may be combined. By combining the two methods above, it is possible to respectively provide the nano wires 111 and 112 on the placement regions 452 and 453 more selectively.

Next, the following explains a step of providing the nano wires 111 and 112 on the substrate. Hereinafter, this step is referred to as "nano wire providing step". The nano wire providing step is carried out after the patterning step in which the method of patterning using the etching and the method of rendering the lyophilic and lyophobic properties to the substrate 101 are combined.

The nano wire providing step in the manufacturing method of the integrated circuit device of the present invention has the following features (1) to (3):

(1) the nano wires are provided in rows in a plurality of steps;

(2) a plurality of nano wires having the same size are provided in rows in one step; and (3) nano wires having a larger size than the other nano wires are sequentially provided in rows first.

Figure 14:
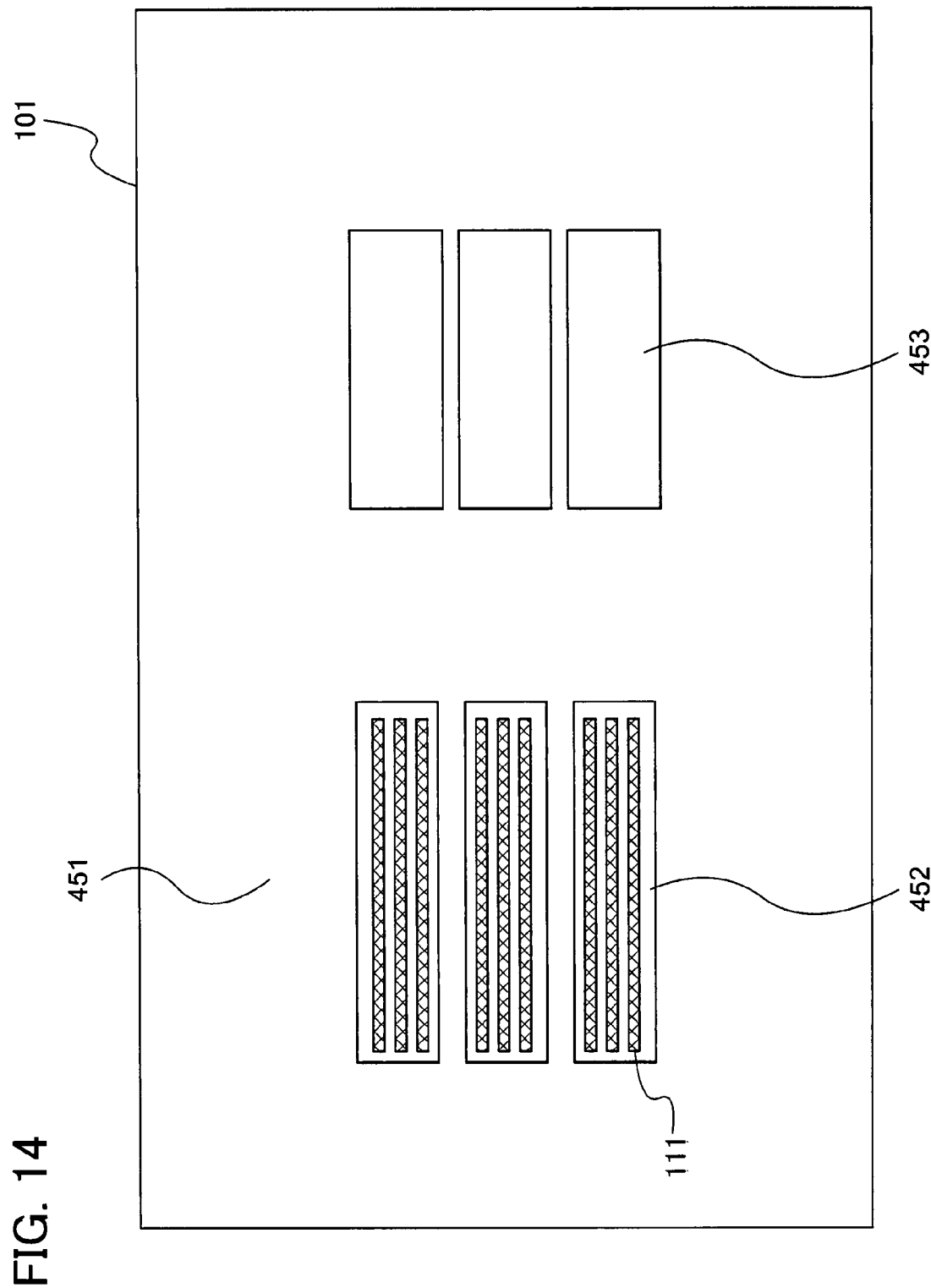
FIG. 14 is a plan view illustrating a first step of providing nano wires in the method for manufacturing the integrated circuit device according to the present invention.
Figure 15:
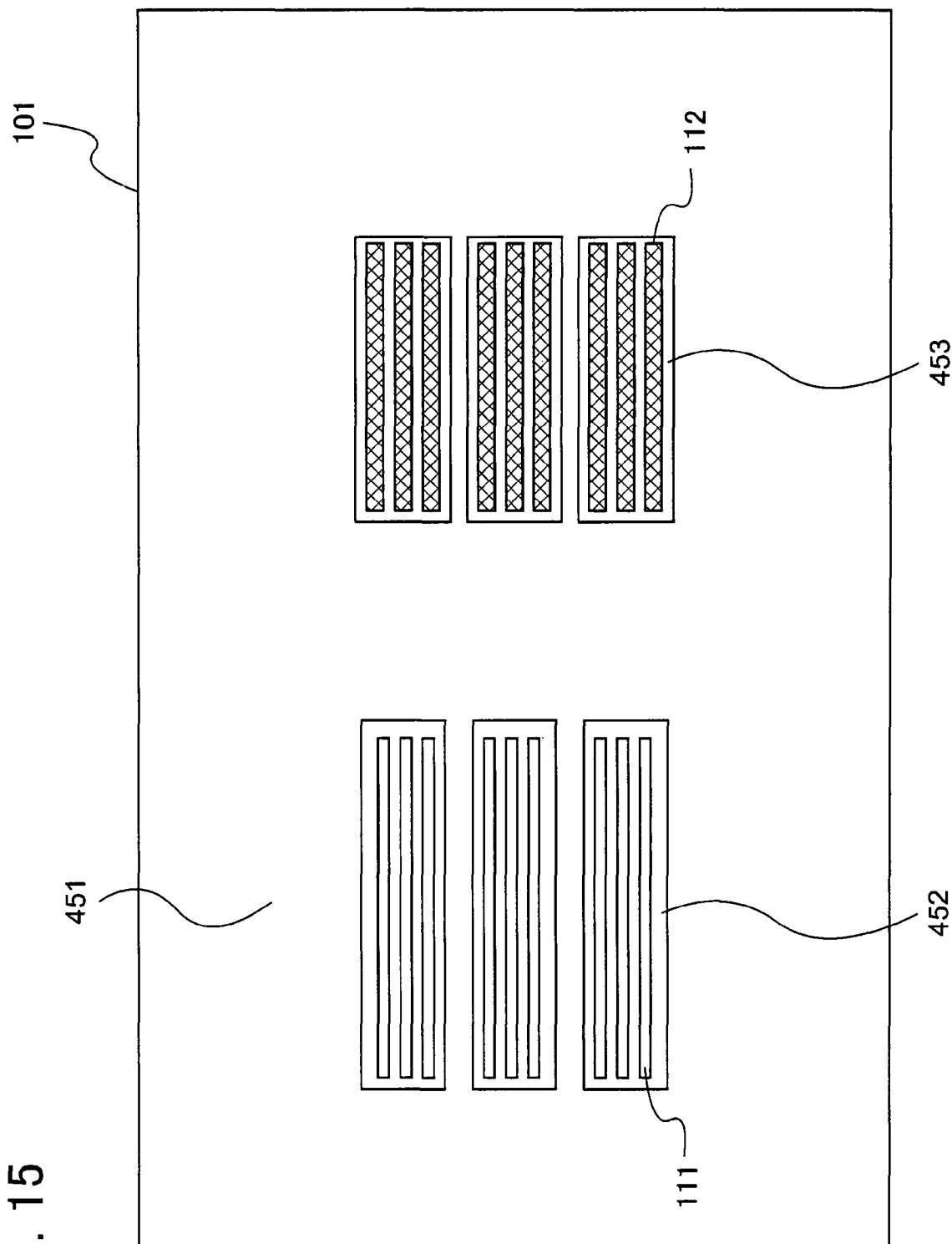
FIG. 15 is a plan view illustrating a second step of providing nano wires, in the method for manufacturing the integrated circuit device according to the present invention.

Now, the following explains the features (1) to (3) of the nano wire providing step according to the present invention, with reference to FIG. 14 and FIG. 15. FIG. 14 illustrates the substrate 101 after the nano wires 111 are provided in rows thereon, whereas FIG. 15 illustrates the substrate 101 after the nano wire 112 are provided in rows thereon.

As apparent from FIG. 14 and FIG. 15, the nano wires 111 and 112 are provided in rows in two steps. In one of the two steps, either the nano wires 111 having the same size or the nano wires 112 having the same size are provided. Further, the nano wires 111 having a larger size than the nano wires 112 are provided in rows first.

Now, the step of providing the nano wires 111 in rows is explained first. As described above, the size of the placement region 452 corresponds to each of the nano wires 111, and the size of the placement region 453 corresponds to each of the nano wires 112. Hence, the nano wires 111 are attached to the placement regions 452. However, the nano wires 111 are almost never attached to the placement regions 453 because the length of each nano wire 111 is longer than the length of the longitudinal side of the rectangular shape of each placement region 453.

Explained next is the case where the nano wires 112 are provided in rows. As described above, each of the placement regions 452 is filled with the nano wires 111, so that the nano wires 112 are only attached to the placement regions 453.

After the application of the solvents in which the nano wires 111 and 112 are respectively dispersed, it is preferable to apply vibrations thereto such as supersonic wave. The application of the vibrations such as supersonic wave allows the nano wires 111 and 112 to be in lines regularly within the recess portions, respectively. That is, the application of the vibrations such as supersonic wave improves alignment of each of the nano wires 111 and 112.

After the nano wires 111 and 112 are attached thereto as a result of applying onto the substrate 101 the solvents in which the nano wires 111 and 112 are dispersed, the solvents are evaporated, thus finishing providing the nano wires 111 and 112 in rows.

By carrying out the patterning step and the nano wire providing step described above, it is possible to provide the two types of nano wire 111 and 112 on the desired placement regions 452 and 453 on the substrate, respectively.

Figure 16:
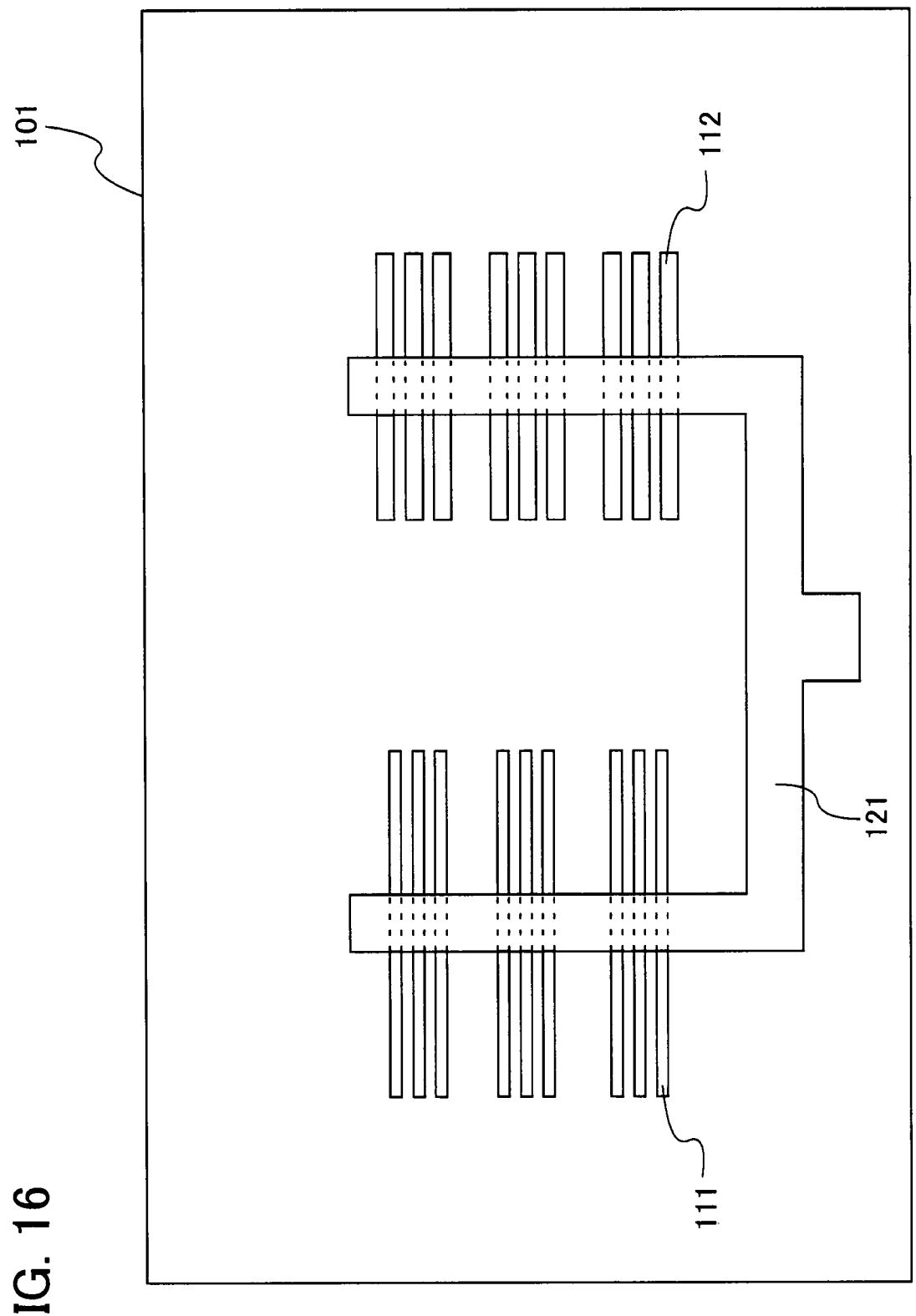
FIG. 16 is a plan view illustrating a step of providing one common wire, in the method for manufacturing the integrated circuit device according to the present invention.

Next, as shown in FIG. 16, the metal wire 121 is formed on the substrate 101. The metal wire 121 can be formed in a desired location on the substrate 101 by using a conventional and publicly known method. A specific example of such a method is a method of depositing a conductor, which is a material for the metal wire 121, on an entire surface of the substrate 101 and carrying out patterning thereto.

Figure 17:
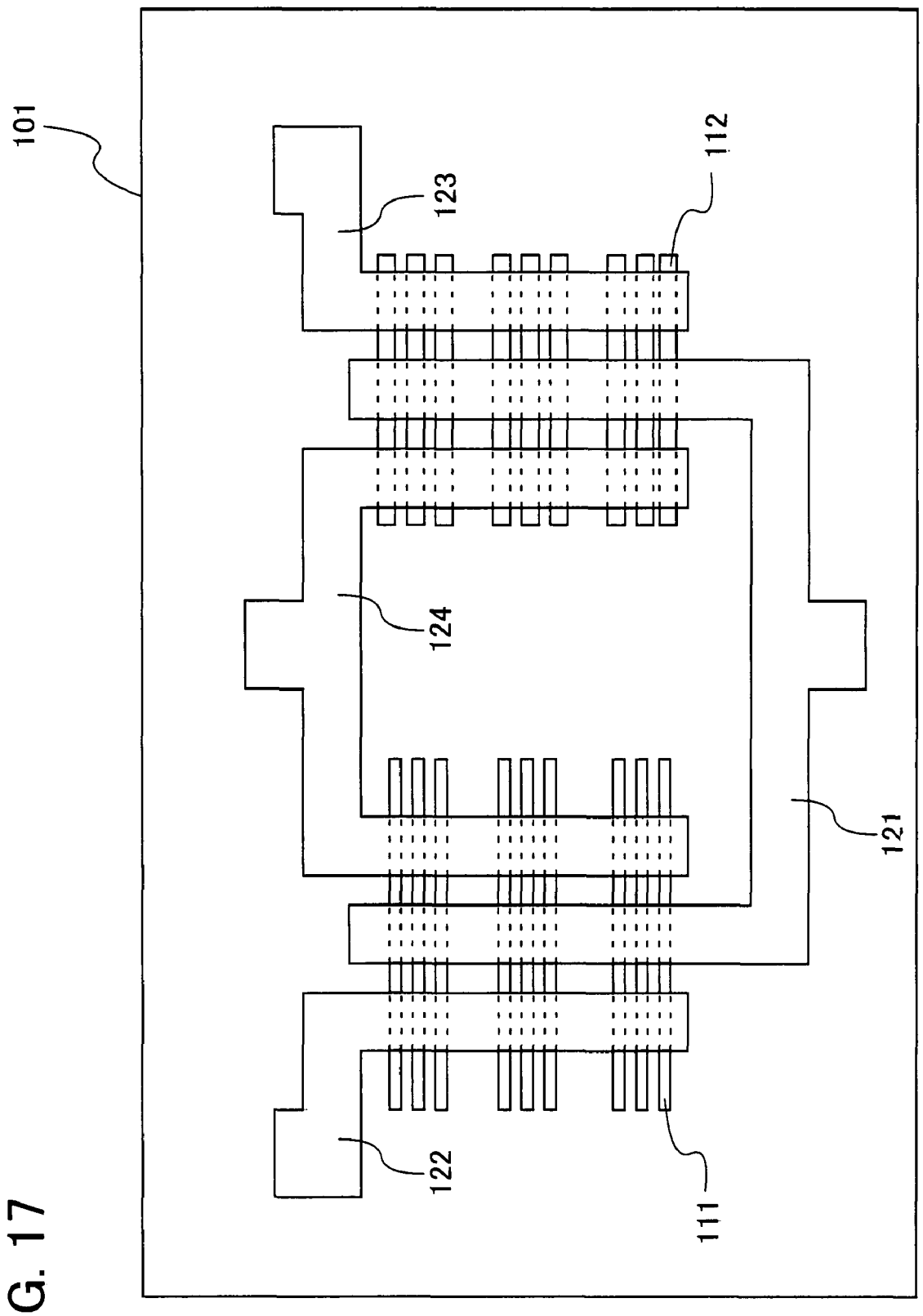
FIG. 17 is a plan view illustrating a step of providing another common wire and other wires, in the method for manufacturing the integrated circuit device according to the present invention.

Next, as shown in FIG. 17, the metal wires 122, 123, and 124 are formed on the substrate 101. The step of forming these three metal wires 122, 123, and 124 may be carried out after depositing the interlayer insulating film 161 on the entire surface of the substrate 101. Then, contact holes are provided in the interlayer insulating film 161 formed on the substrate 101 for the sake of providing the metal wires 122, 123, and 124. Next, a material for each of the metal wires 122, 123, and 124 is deposited on the entire surface of the substrate 101, and then is patterned. In this way, the metal wires 122, 123, and 124 are provided on the desired locations. With these procedures, the integrated circuit device 1 explained in Embodiment 1 is manufactured.

As described above, the method of the present embodiment for manufacturing the integrated circuit device 1 includes: the patterning step of forming the placement regions 452 and 453 respectively corresponding to the different types of nano wire element; and the nano wire providing step of providing the nano wires 111 and 112 on the substrate 101 after the patterning step, the nano wires 111 and 112, which respectively constitute the different types of nano wire element, having sizes differing depending on the types of nano wire element, the patterning step being a step of forming the placement regions having sizes corresponding to the sizes of said nano wires, respectively, (1) the nano wire providing step including a plurality of steps, (2) a plurality of nano wires having an identical size being provided in rows in one step of the nano wire providing step, (3) said nano wires being provided sequentially in order from nano wires having a larger size, in the nano wire providing step.

The use of the manufacturing method above makes it possible to selectively provide the different types of nano wire 111 and 112 in the desired locations. Therefore, the integrated circuit device 1 including the different types of nano wire element can be manufactured.

Further, by forming the recess patterns for the placement regions 452 and 453 on the substrate 101 in the patterning step, it is possible to improve selectivity in providing the nano wires 111 and 112 in rows in the desired locations.

Further, the selectivity in providing the nano wires in rows in the desired locations is improved by carrying out the nano wire providing step and the patterning step as follows: the nano wire providing step includes the process of applying solvents in which the nano wires 111 and 112 are dispersed, the nano wires 111 or 112 having the same size are dispersed in one of the solvents, and the patterning step includes a process of (i) rendering, to the placement regions 452 and 453, a lyophilic property to the solvents and (ii) rendering, to a region other than the placement regions, a lyophobic property to the solvents.

Embodiment 5

Figure 18:
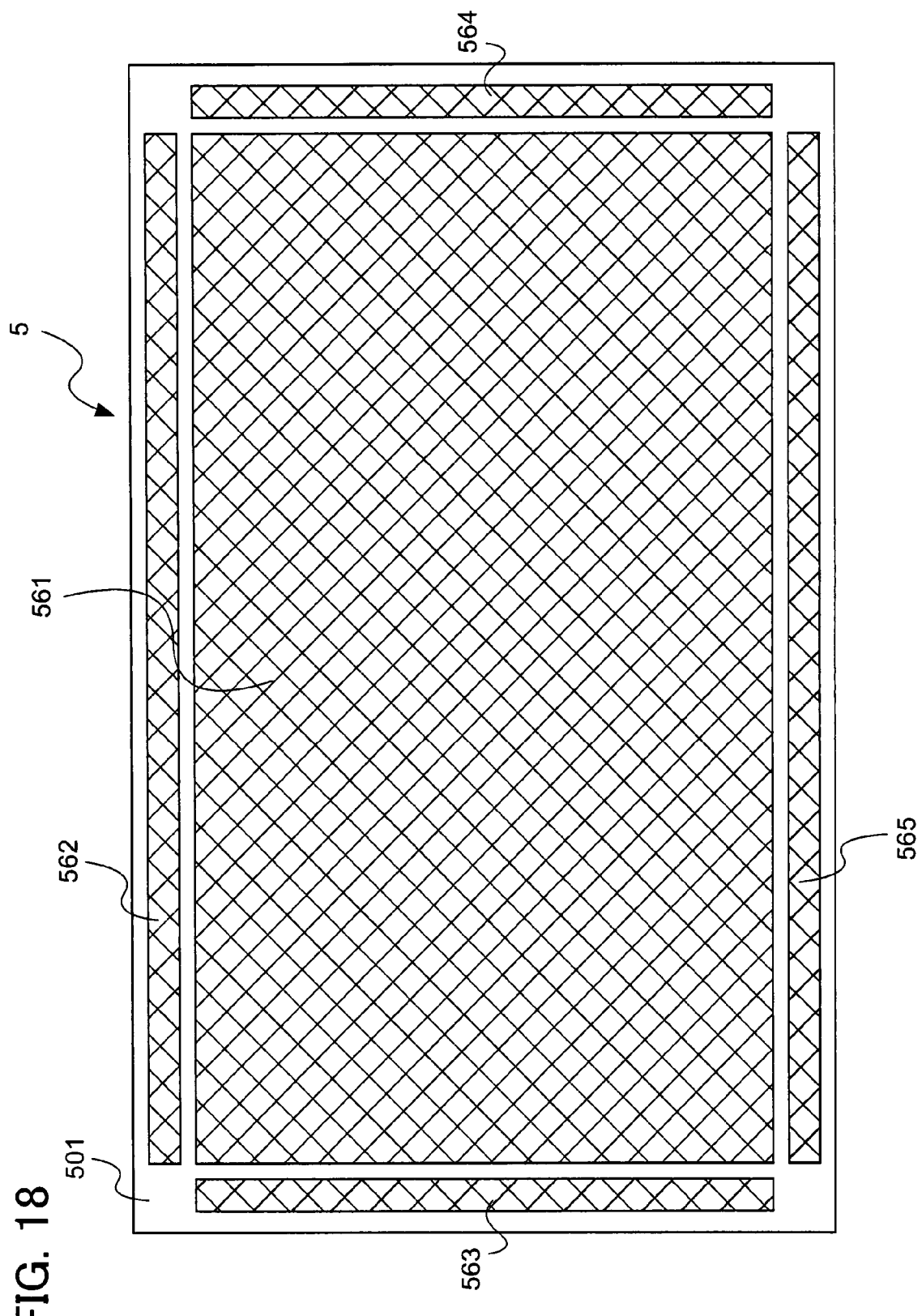
FIG. 18 is a plan view illustrating an internal structure of a display panel of a display device according to the present invention.

The following explains a display device including the integrated circuit device of the present invention, with reference to FIG. 18. FIG. 18 is a plan view illustrating the structure of the display device of the present embodiment.

The display device includes a display panel 5 having one transparent substrate 501 on which a display section 561, a logical circuit section 562, a logical circuit section 563, a logical circuit section 564, and a logical circuit section 565 are provided. In cases where the display device is a liquid crystal display device, the display section 561 is provided with (i) a nano wire transistor required for pixel driving, (ii) a pixel electrode, and the like.

Further, in cases where a light emitting element made up of the plurality of nano wires is used instead of the pixel electrode, it is possible to realize a display device in which a logical circuit and a light emitting pixel are provided in the display panel. The logical circuit constituted by the nano wire transistor carries out image processing, other calculation, and the like in the logical circuit section 562, the logical circuit section 563, the logical circuit section 564, or the logical circuit section 565.

Conventionally, a TFT has been used as a transistor for pixel driving and image processing. By replacing the TFT with the nano wire element, the following shortcomings of the TFT can be overcome.

For the gate insulating film of the TFT, a CVD (Chemical Vapor Deposition) oxide film using TEOS (tetra ethyl orthosillicate) is usually used. For this reason, the TFT has a mutual conductance, which is low and greatly varies as compared with that of the MOS transistor in which the gate insulating film is formed by thermal oxidation and which is manufactured using the single crystal silicon substrate.

Meanwhile, as the material for the core of the MOS transistor using the nano wires, single crystal silicon can be used. Therefore, the use of the nano wires allows formation of a completely depleted transistor of surround gate type. As such, the nano wire MOS transistor has a mutual conductance, which is high and varies little as compared with that of the conventional MOS transistor.

As described above, the display device in which the integrated circuit device of the present invention and the display section are provided on the same substrate has better performance than the display device using the TFT. Hence, driving voltage for the display device can be decreased and electric power consumption becomes low.

Next, for attainment of such a structure that the display device includes the TFT, it is impossible to manufacture the display device and the TFT independently. In other words, in order to manufacture the display device including the TFT, large scale equipment such as massive vacuum device and deposition device is required.

On the other hand, in the case of the display device including the nano wire MOS transistor, the nano wire manufacturing step and the display device manufacturing step are independent from each other. This makes it possible to manufacture the display device with the use of relatively small equipment. Accordingly, manufacturing cost for the display device is greatly decreased.

The integrated circuit device of the present invention includes the substrate on which two or more types of nano wire element having different functions, containing different materials, and/or having different properties are provided. Further, the display device according to the present invention is arranged such that the integrated circuit device and the display section are provided on the same substrate. Hence, the functions thereof are dramatically improved as compared with the case where one type of nano wire element is used in the display device.

The present invention is not limited to the description of the embodiments above, but may be altered by a skilled person within the scope of the claims. An embodiment based on a proper combination of technical means disclosed in different embodiments is encompassed in the technical scope of the present invention.

It is preferable to arrange the integrated circuit device of the present invention such that: the at least two types of nano wire element are further made up of at least two types of nano wire element containing different materials.

With the above structure, it is possible to dramatically improve the function of the integrated circuit device as compared with the conventional integrated circuit device including nano wire elements of one type.

Further, it is preferable to arrange the integrated circuit device of the present invention such that: the at least two types of nano wire element are further made up of at least two types of nano wire element having different functions.

With the above structure, in the integrated circuit device, an N type electric field transistor and a P type electric field transistor can be provided on the same substrate, for example. This makes it possible to construct a complex logical circuit by combining such basic logical circuits. Further, it is possible to construct a complementary circuit.

Hence, it is possible to dramatically improve the function of the integrated circuit device as compared with the conventional integrated circuit device including nano wire elements of one type.

Further, it is preferable to arrange the integrated circuit device such that: each of the at least two types of nano wire element is constituted by nano wires, and the nano wires have sizes differing depending on the types of nano wire element.

In the above structure, in cases where the at least two types of nano wire element have different functions, it is possible to say that the nano wire elements made up of the nano wires having different sizes are nano wire elements having different functions. On the other hand, in cases where the at least two types of nano wire element contain different materials, it is possible to say that the nano wire elements made up of the nano wires having different sizes are nano wires containing different materials.

Therefore, by providing, on a desired region of the substrate, a plurality of nano wires having a first size and providing, on another desired region of the substrate, a plurality of nano wires having a second size, two nano wire elements having different functions or containing different materials can be provided on the same substrate. Thus, such a plurality of nano wire elements having different functions or containing different materials can be provided in desired locations with ease, respectively.

Further, it is preferable to arrange the integrated circuit device of the present invention such that: the at least two types of nano wire element include a light emitting element and a switching element.

According to the above structure, a logical circuit made up of a transistor and having a light emitting function can be formed on the same substrate. For example, by using a light emitting element as a light emitting source of a display device, it is possible to realize a display device having a display panel in which a logical circuit and a light emitting pixel are provided.

This makes it possible to reduce the size of the integrated circuit device, give high performance thereto, and reduce cost thereof at the same time.

Further, it is preferable to arrange the integrated circuit device such that: the at least two types of nano wire element containing the different materials have different voltage endurance properties.

With the above structure, circuits which require different driving voltages can be provided on the same substrate. Therefore, according to the above structure, it is possible to reduce the size of the integrated circuit device, give high performance thereto, and reduce cost thereof at the same time.

Further, it is preferable to arrange the integrated circuit device of the present invention such that: each of the at least two types of nano wire element is constituted by 10 to 200 nano wires.

Now, consider a case where each nano wire element is constituted by 9 or smaller nano wires. In this case, a sufficient current for driving the element cannot be secured, and variation of current flowing through the nano wires cannot be averaged, with the result that variation in driving current for the nano wire element becomes large. On the other hand, in cases where each nano wire element is constituted by more than 200 nano wires, the size of the element becomes too large. This makes it difficult to apply the nano wire element to various devices having small sizes.

With the above structure, the nano wire element according to the present invention makes it possible to reduce variation in driving current, secure sufficient driving current, and downsizing of element at the same time.

Further, it is preferable to arrange the integrated circuit device of the present invention such that: the at least two types of nano wire element share a common wire.

With the above structure, in cases where, e.g., the at least two types of nano wire element having different functions share the common wire, it is possible to (1) convert or process one electric signal in stages, (2) control a plurality of elements at the same time, and (3) drive the elements by using one electric signal.

Meanwhile, in cases where the at least two types of nano wire element having different materials share the common wire, an electric signal, which is received by one nano wire element, is sent to the other nano wire element via the common wire. Accordingly, the signal is processed (converted) differently in the nano wires. As such, it is possible to convert (process) one electric signal in stages and to drive a plurality of elements by using one electric signal.

A method of the present invention for manufacturing an integrated circuit device includes: a patterning step of forming, on a substrate, placement regions allowing nano wires to be selectively provided therein and respectively corresponding to different types of nano wire element; and a nano wire providing step of providing the nano wires on the substrate after the patterning step, the nano wires, which respectively constitute the different types of nano wire element, having sizes differing depending on the types of nano wire element, the patterning step being a step of forming the placement regions having sizes corresponding to the sizes of said nano wires, respectively, the nano wire providing step including a plurality of steps, a plurality of nano wires having an identical size being provided in rows in one step of the nano wire providing step, the nano wires being provided sequentially in order from nano wires having a largest size, in the nano wire providing step.

According to the above manufacturing method, the plurality of placement regions for selectively providing the nano wires in rows are formed on the substrate in the patterning step. Here, the placement regions are formed to have sizes corresponding to the sizes (e.g., lengths and thicknesses) of the nano wires constituting the nano wire elements, respectively.

Next, in the nano wire providing step, the nano wires are provided in the placement regions thus formed on the substrate. Further, one type of nano wire element is constituted by nano wires having the same size. The nano wires having the same size are selectively provided in the placement region corresponding to the size. Therefore, one type of nano wire element is provided in one step of the nano wire providing step.

In the nano wire providing step, the nano wires are provided in steps. Therefore, nano wire elements of types corresponding to the number of the steps in the nano wire providing step can be formed on the same substrate.

Further, the nano wires are provided in order from nano wires having the largest size. For example, the nano wires having the largest size are provided in rows in the largest placement region, but are larger than the second largest placement region, so that the nano wires having the largest size are never caught in the second largest placement region. Further, although nano wires having the smallest size can be caught in any of the placement regions, the nano wires having the smallest size are provided in the smallest placement region because the foregoing nano wires have been already provided in the placement regions other than the smallest placement region.

As such, it is possible to respectively provide a plurality of nano wire elements in desired regions on the same substrate accurately and easily.

Further, it is preferable to arrange the method of the present invention such that: in the patterning step, recess patterns are formed for the placement regions on the substrate, respectively.

This allows each of the placement regions to be in the form of recess, so that the nano wires are contained therein. Accordingly, positioning of the nano wires becomes easy.

Further, it is preferable to arrange the method of the present invention such that: the nano wire providing step is a step of applying solvents in which the nano wires are respectively dispersed, the nano wires dispersed in the solvents have identical lengths respectively, and in the patterning step, a lyophilic property to the solvents is rendered to the placement regions and a lyophobic property to the solvents is rendered to a region other than the placement regions.

According to the above manufacturing method, the nano wires having the same length are dispersed in one solvent, and the solvent is applied to the substrate. In the patterning step, the placement regions are rendered the lyophilic property to the solvents, and the region other than the placement regions is rendered the lyophobic property thereto. For example, when the solvents in which the nano wires are dispersed are applied to the regions thus rendered the lyophilic property, the placement regions catch the solvents well, respectively. As such, the nano wires can be provided therein with ease. Meanwhile, when the solvents in which the nano wires are dispersed are applied to the region rendered the lyophobic property, the region repels the solvents, so that the nano wires are never provided therein.

This allows more highly selective placement of the nano wires.

Further, it is preferable to arrange a display device according to the present invention such that: the integrated circuit device and a display section are provided on the same substrate.

According to the above structure, the display device according to the present invention includes the integrated circuit device having more excellent function than the integrated circuit including one type of nano wire element, and it is possible to provide the nano wires in rows with the use of relatively small scale equipment so as to form the nano wire elements.

Further, in cases where the nano wires are made of silicon and constitute a transistor, such a transistor has high mutual conductance and has little variation in an electric property, as compared with a TFT (thin film transistor). Thus, the transistor has high performance.

Accordingly, the display device according to the present invention makes it possible to realize a function better than that of the display device using the conventional TFT, reduce electric power consumption as a result of reducing driving voltage, and reduce manufacturing cost.

What is claimed is:

1. An integrated circuit device, comprising an substrate on which a plurality of nano wire elements are provided,
   said plurality of nano wire elements including at least two types of nano wire element having different functions,
   each of said at least two types of nano wire element being constituted by 10 to 200 nano wires,
   each of said at least two types of nano wire element is constituted by nano wires, and the nano wires have lengths differing depending on the types of nano wire element, and
   placement regions having different longitudinal lengths corresponding to different lengths of different types of nano wire are provided on the substrate, and each of the placement regions includes nano wires having a corresponding length therein in rows.

2. The integrated circuit device as set forth in claim 1, wherein: said at least two types of nano wire element are further made up of at least two types of nano wire element containing different materials.

3. The integrated circuit device as set forth in claim 1, wherein: said at least two types of nano wire element are made up of a light emitting element and a switching element.

4. The integrated circuit device as set forth in claim 1, wherein: said at least two types of nano wire element share a common wire.

5. An integrated circuit device, comprising a substrate on which a plurality of nano wire elements are provided,
   said plurality of nano wire elements including at least two types of nano wire element containing different materials,
   each of said at least two types of nano wire element being constituted by 10 to 200 nano wires,
   each of said at least two types of nano wire element is constituted by nano wires, and the nano wires have lengths differing depending on the types of nano wire element, and
   placement regions having different longitudinal lengths corresponding to different lengths of different types of nano wire are provided on the substrate, and each of the placement regions includes nano wires having a corresponding length therein in rows.

6. The integrated circuit device as set forth in claim 5, wherein: said at least two types of nano wire element are further made up of at least two types of nano wire element having different functions.

7. The integrated circuit device as set forth in claim 5, wherein: said at least two types of nano wire element are made up of a light emitting element and a switching element.

8. The integrated circuit device as set forth in claim 5, wherein: said at least two types of nano wire element have different voltage endurance properties.

9. The integrated circuit device as set forth in claim 5, wherein: said at least two types of nano wire element share a common wire.

10. A display device, comprising: an integrated circuit device, including an substrate on which a plurality of nano wire elements are provided, said plurality of nano wire elements including either (i) at least two types of nano wire element having different functions or (ii) at least two types of nano wire element containing different materials; and
    a display section,
    the display section being provided on the substrate of the integrated circuit device,
    each of said at least two types of nano wire element being constituted by 10 to 200 nano wires,
    each of said at least two types of nano wire element is constituted by nano wires, and the nano wires have lengths differing depending on the types of nano wire element, and
    placement regions having different longitudinal lengths corresponding to different lengths of different types of nano wire are provided on the substrate, and each of the placement regions includes nano wires having a corresponding length therein in rows.

* * * * *